(12) United States Patent
Jung

(10) Patent No.: US 11,640,842 B2
(45) Date of Patent: *May 2, 2023

(54) RESISTIVE MEMORY DEVICE AND METHOD OF PROGRAMMING THE SAME

(71) Applicant: SAMSUNG ELECTRONICS CO., LTD., Suwon-si (KR)

(72) Inventor: Moonki Jung, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/827,846

(22) Filed: May 30, 2022

(65) Prior Publication Data

US 2022/0293177 A1    Sep. 15, 2022

Related U.S. Application Data

(63) Continuation of application No. 16/986,950, filed on Aug. 6, 2020, now Pat. No. 11,355,189.

(30) Foreign Application Priority Data

Feb. 6, 2020 (KR) .................. 10-2020-0014347

(51) Int. Cl.
| | | |
|---|---|---|
| *G11C 16/04* | (2006.01) | |
| *G11C 13/00* | (2006.01) | |
| *G11C 11/16* | (2006.01) | |
| *H01L 25/065* | (2023.01) | |
| *H01L 25/18* | (2023.01) | |
| *H01L 23/00* | (2006.01) | |

(52) U.S. Cl.
CPC ...... *G11C 13/0069* (2013.01); *G11C 11/1675* (2013.01); *H01L 24/05* (2013.01); *H01L 24/08* (2013.01); *H01L 25/0657* (2013.01); *H01L 25/18* (2013.01); *G11C 2013/0092* (2013.01); *H01L 2224/05147* (2013.01); *H01L 2224/08145* (2013.01); *H01L 2924/1431* (2013.01); *H01L 2924/1443* (2013.01)

(58) Field of Classification Search
CPC ............ G11C 13/0069; G11C 11/1675; G11C 2013/0092
See application file for complete search history.

(56) References Cited

U.S. PATENT DOCUMENTS

| | | | |
|---|---|---|---|
| 6,791,894 | B2 | 9/2004 | Nagai et al. |
| 7,511,997 | B2 | 3/2009 | Toda |
| 7,518,923 | B2 | 4/2009 | Mokhlesi |
| 7,746,688 | B2 | 6/2010 | Kim et al. |

(Continued)

*Primary Examiner* — Pho M Luu
(74) *Attorney, Agent, or Firm* — Volentine, Whitt & Francos, PLLC

(57) ABSTRACT

A method of programming a resistive memory device, and a corresponding resistive memory device, which includes the resistive memory device, in response to a write command, applying a write pulse to a selected memory cell arranged in a region where a selected word line intersects with a selected bit line; and after the applying the write pulse, applying a dummy pulse to at least one unselected memory cell. The at least one unselected memory cell is connected to at least one of the selected word line, the selected bit line, a first word line adjacent to the selected word line, and a first bit line adjacent to the selected bit line.

20 Claims, 26 Drawing Sheets

(56) References Cited

U.S. PATENT DOCUMENTS

| | | | |
|---|---|---|---|
| 7,965,545 B2 | 6/2011 | Savransky et al. | |
| 8,271,856 B2 | 9/2012 | Kang et al. | |
| 8,369,151 B2 * | 2/2013 | Yoneya | G11C 17/165 |
| | | | 365/158 |
| 8,482,994 B2 | 7/2013 | Lee et al. | |
| 8,929,140 B2 | 1/2015 | Nagashima | |
| 9,269,429 B2 | 2/2016 | Park et al. | |
| 9,384,801 B2 | 7/2016 | Pandey et al. | |
| 10,127,978 B2 | 11/2018 | Oh et al. | |
| 10,991,760 B2 * | 4/2021 | Hong | H01L 27/0629 |
| 11,355,189 B2 * | 6/2022 | Jung | H01L 25/0657 |
| 2016/0203047 A1 | 7/2016 | No et al. | |
| 2016/0358643 A1 | 12/2016 | Kolar et al. | |
| 2021/0098064 A1 * | 4/2021 | Lee | G11C 13/0038 |

* cited by examiner

FIG. 7

| Cell group | Memory cells | APPLIED VOLTAGE |
|---|---|---|
| GR1 | MC32, MC12 | V1 |
| GR2 | MC21, MC23 | V2 |
| GR3 | MC31, MC33 MC11, MC13 | V3 |

FIG. 12

| Cell group | Memory cells | APPLIED VOLTAGE |
|---|---|---|
| GR1 | MC22-MC24, MC32, MC34 MC42-MC44 | V1 |
| GR2 | MC12-MC14, MC21, MC25 MC31, MC35 MC41, MC45 MC52-MC54 | V2 |
| GR3 | MC11, MC15 MC51, MC55 | V3 |

FIG. 14

| Cell group | Memory cells | APPLIED VOLTAGE |
|---|---|---|
| GR1 | MC23, MC43 | V1 |
| GR2 | MC32, MC34 | V2 |
| GR3 | MC22, MC24 MC42, MC44 | V3 |
| GR4 | MC11−MC15 MC21, MC25 MC31, MC35 MC41, MC45 MC51−MC55 | V4 |

FIG. 16

| Cell group | Memory cells | APPLIED VOLTAGE |
|---|---|---|
| GR1 | MC22u<br>MC32d, MC21d<br>MC23d, MC12d | V1 |
| GR2 | MC31d, MC33d<br>MC11d, MC13d | V2 |
| GR3 | MC31u-MC33u<br>MC21u, MC23u<br>MC11u-MC13u | V3 |

RESISTIVE MEMORY DEVICE AND METHOD OF PROGRAMMING THE SAME

CROSS-REFERENCE TO RELATED APPLICATION

This is a Continuation of U.S. application Ser. No. 16/986,950, filed Aug. 6, 2020, which issued as U.S. Pat. No. 11,355,189 on Jun. 7, 2022, and a claim of priority under 35 U.S.C. § 119 is made to Korean Patent Application No. 10-2020-0014347, filed on Feb. 6, 2020, in the Korean Intellectual Property Office, the entirety of which is hereby incorporated by reference.

BACKGROUND

The present disclosure relates to memory devices, and more particularly to resistive memory devices and methods of programming resistive memory devices.

Flash memories, and resistive memory devices such as phase change RAM (PRAM), nano floating gate memory (NFGM), polymer RAM (PoRAM), magnetic RAM (MRAM), ferroelectric RAM (FeRAM), and resistive RAM (RRAM), are examples of non-volatile memory devices. Resistive memory devices share the high speed characteristics of DRAM and the non-volatile characteristics of flash memory. Memory cells of resistive memory devices may have a resistance distribution according to programmed data.

SUMMARY

Embodiments of the inventive concepts provide a method of programming a resistive memory device, the method including in response to a write command, a write driver applying a write pulse to a selected memory cell arranged in a region where a selected word line intersects with a selected bit line; and after the applying the write pulse, the write driver applying a dummy pulse to at least one unselected memory cell. The at least one unselected memory cell is connected to at least one of the selected word line, the selected bit line, a first word line adjacent to the selected word line, and a first bit line adjacent to the selected bit line.

Embodiments of the inventive concepts further provide a method of programming a resistive memory device, the method including in response to a first write command, a write driver applying a reset write pulse to a first selected memory cell arranged in a region where a first selected word line intersects with a first selected bit line; after the applying the reset write pulse, the write driver applying a first dummy pulse to at least one first unselected memory cell connected to at least one of the first selected word line, the first selected bit line, a first word line adjacent to the first selected word line, and a first bit line adjacent to the first selected bit line; in response to a second write command, the write driver applying a set write pulse to a second selected memory cell arranged in a region where a second selected word line intersects with a second selected bit line; and after the applying the set write pulse, the write driver applying a second dummy pulse to at least one second unselected memory cell connected to at least one of the second selected word line, the second selected bit line, a second word line adjacent to the second selected word line, and a second bit line adjacent to the second selected bit line. The number of first unselected memory cells is greater than the number of second unselected memory cells.

Embodiments of the inventive concept still further provide a resistive memory device including a memory cell region including a first metal pad; a peripheral circuit region including a second metal pad and vertically connected to the memory cell region by the first metal pad and the second metal pad; a memory cell array in the memory cell region, the memory cell array including a plurality of memory cells respectively arranged in regions where a plurality of word lines intersect with a plurality of bit lines; and a write/read circuit in the peripheral circuit region, the write/read circuit being configured to apply a write pulse to a selected memory cell of the plurality of memory cells and a dummy pulse to at least one unselected memory cell of the plurality of memory cells during a write operation on the selected memory cell of the plurality of memory cells. The at least one unselected memory cell is connected to at least one of a selected word line connected to the selected memory cell, a selected bit line connected to the selected memory cell, a first word line adjacent to the selected word line, and a first bit line adjacent to the selected bit line.

Embodiments of the inventive concept still further provide a resistive memory device including a memory cell array including a plurality of memory cells respectively arranged in regions where a plurality of word lines intersect with a plurality of bit lines; and a write/read circuit configured to apply a write pulse to a selected memory cell of the plurality of memory cells and a dummy pulse to at least one unselected memory cell of the plurality of memory cells during a write operation on the selected memory cell of the plurality of memory cells. The at least one unselected memory cell is connected to at least one of a selected word line connected to the selected memory cell, a selected bit line connected to the selected memory cell, a first word line adjacent to the selected word line, and a first bit line adjacent to the selected bit line.

Embodiments of the inventive concepts also provide a resistive memory device including a memory cell array including a plurality of memory cells respectively arranged in regions where a plurality of word lines intersect a plurality of bit lines; a controller configured to determine a selected memory cell from among the memory cell array and at least first and second groups of unselected memory cells from among the memory cell array responsive to a write request from a host; and a write/read circuit configured to apply a write pulse to the selected memory cell, a first dummy pulse to the first group of unselected memory cells and a second dummy pulse to the second group of unselected memory cells during a write operation responsive to the controller.

BRIEF DESCRIPTION OF THE DRAWINGS

Embodiments of the inventive concepts will be more clearly understood from the following detailed description taken in conjunction with the accompanying drawings in which:

FIG. 7 illustrates applied voltages for a plurality of cell groups, according to embodiments of the inventive concepts;

FIG. 12 illustrates applied voltages for memory cells illustrated in FIG. 11, according to embodiments of the inventive concepts;

FIG. 14 illustrates applied voltages for memory cells illustrated in FIG. 13, according to embodiments of the inventive concepts;

FIG. 16 illustrates applied voltages for memory cells illustrated in FIG. 15, according to embodiments of the inventive concepts;

DETAILED DESCRIPTION OF THE EMBODIMENTS

Hereinafter, embodiments of the inventive concept will be described in detail with reference to the accompanying drawings.

As is traditional in the field of the inventive concepts, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

Figure 1:
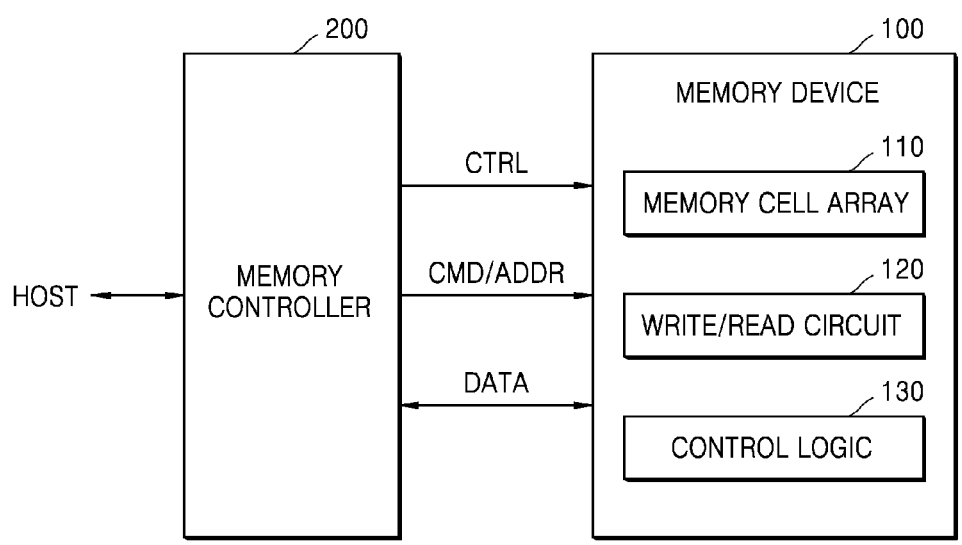
FIG. 1 illustrates a block diagram of a memory system according to embodiments of the inventive concepts.

FIG. 1 illustrates a block diagram of a memory system 10 according to embodiments of the inventive concepts.

Referring to FIG. 1, the memory system 10 may include a memory device 100 and a memory controller 200. The memory device 100 may include a memory cell array 110, a write/read circuit 120, and a control logic (e.g., a control circuit or a controller) 130. In an embodiment, the memory cell array 110 may include a plurality of resistive memory cells, and the memory device 100 may be referred to as a "resistive memory device". However, the inventive concepts are not limited thereto, and the memory cell array 110 may include various types of other memory cells.

The memory device 100 may be implemented in various forms. As an example, the memory device 100 may be a device implemented with one memory chip. Alternatively, the memory device 100 may be defined as a device including a plurality of memory chips, and as an example, the memory device 100 may be a memory module in which a plurality of memory chips are mounted on a board. However, embodiments of the inventive concepts are not limited thereto, and the memory device 100 may be implemented in various forms such as for example a semiconductor package including memory dies.

The memory controller 200 may control the memory device 100 to read data stored in the memory device 100 or to write data to the memory device 100 in response to a write/read request from a host HOST. Specifically, the memory controller 200 may provide an address ADDR, a command CMD, and a control signal CTRL to the memory device 100 to control program (or write), read, and erase operations, etc. on the memory device 100. Also, write data DATA and read data DATA may be transmitted and received between the memory controller 200 and the memory device 100.

The memory cell array 110 may for example include a plurality of memory cells respectively arranged in regions where a plurality of first signal lines intersect with a plurality of second signal lines. In an embodiment, the first signal line may be one of a bit line and a word line, and the second signal line may be the other of the bit line and the word line. Accordingly, the memory device 100 may be referred to as a "cross-point memory device".

Each of the plurality of memory cells may be a single level cell storing one bit, or a multi-level cell capable of storing at least 2 bits or more of data. Also, the memory cells may have a plurality of resistance distributions according to the number of bits stored in each memory cell. For example, when one bit of data is stored in each memory cell, the memory cells may have two resistance distributions, and when two bits of data are stored in each memory cell, the memory cells may have four resistance distributions.

The memory cell array 110 may include resistive memory cells, each of which includes a variable resistor element. For example, when the variable resistor element includes a phase change material and the resistance of the variable resistor element changes with temperature, the resistive memory device may be PRAM. As another example, when the variable resistor element includes an upper electrode, a lower electrode, and a complex metal oxide therebetween, the resistive memory device may be RRAM. As another example, when the variable resistor element includes an upper electrode of a magnetic material, a lower electrode of a magnetic material, and a dielectric material therebetween, the resistive memory device may be MRAM. Hereinafter, the term "memory cell" will be used to refer to a resistive memory cell.

A write/read circuit 120 may provide a constant voltage or current to a selected memory cell through a selected first signal line or a selected second signal line, which is connected to the selected memory cell, during data write and read operations on the selected memory cell among the plurality of memory cells. For example, when a write operation is performed, the write/read circuit 120 may provide a write pulse to the selected first signal line and/or the selected second signal line. For example, when a read operation is performed, the write/read circuit 120 may provide pre-charge voltages to the selected first signal line and/or the selected second signal line, and then may sense a voltage level of the selected first signal line or the selected second signal line.

In an embodiment, in response to a write command or program command received from the memory controller 200, the write/read circuit 120 may apply a write pulse to a selected memory cell and then apply a dummy pulse to at least one unselected memory cell, during a write operation on the selected memory cell. According to such an embodiment, the dummy pulse may be referred to as an "anneal pulse". Also according to such an embodiment, the operation of applying the dummy pulse may be referred to as a "dummy read operation".

The selected memory cell may be arranged in a region where a word line and a bit line selected according to the address ADDR received from the memory controller 200 intersect with each other. The at least one unselected memory cell may be a memory cell adjacent to the selected memory cell. However, the inventive concepts are not limited thereto, and the at least one unselected memory cell may be connected to at least one of a selected word line, a selected bit line, a word line adjacent to the selected word line, and a bit line adjacent to the selected bit line.

The control logic 130 may perform various memory operations such as data writing and reading by controlling various components of the memory device 100. In an embodiment, the control logic 130 may control the write/read circuit 120 to apply a write pulse to a selected memory cell and then apply a dummy pulse to an unselected memory cell, during a write operation on the selected memory cell. The write pulse may include a set write pulse and a reset write pulse. For example, the amplitude of the dummy pulse may be less than that of the write pulse. For example, the pulse width of the dummy pulse may be narrower than that of the write pulse. For example, the amplitude and/or pulse width of the dummy pulse may be determined differently based on a distance between the unselected memory cell and the selected memory cell.

During a write operation on the selected memory cell, heat generated in the selected memory cell due to the write pulse may affect a threshold voltage distribution of adjacent memory cells. A phenomenon in which a threshold voltage distribution of adjacent memory cells changes during a write operation may be referred to as a "write disturb" or a "thermal disturb". Due to the write disturb, a problem in which a read window for adjacent memory cells decreases may occur and a read error may occur during a read operation on adjacent memory cells, and accordingly, the reliability of the memory device 100 may be deteriorated.

However, according to embodiments of the inventive concepts, during a write operation on a selected memory cell, a write pulse may be applied to the selected memory cell and then a dummy pulse may be applied to at least one unselected memory cell, and thus, a threshold voltage distribution of the at least one unselected memory cell may be restored. Thus, a write disturb for the at least one unselected memory cell may be reduced, and a read window for the at least one unselected memory cell may be secured. Accordingly, a read error may be prevented during a read operation on at least one unselected memory cell, and accordingly, the reliability of the memory device 100 may be improved.

Figure 2:
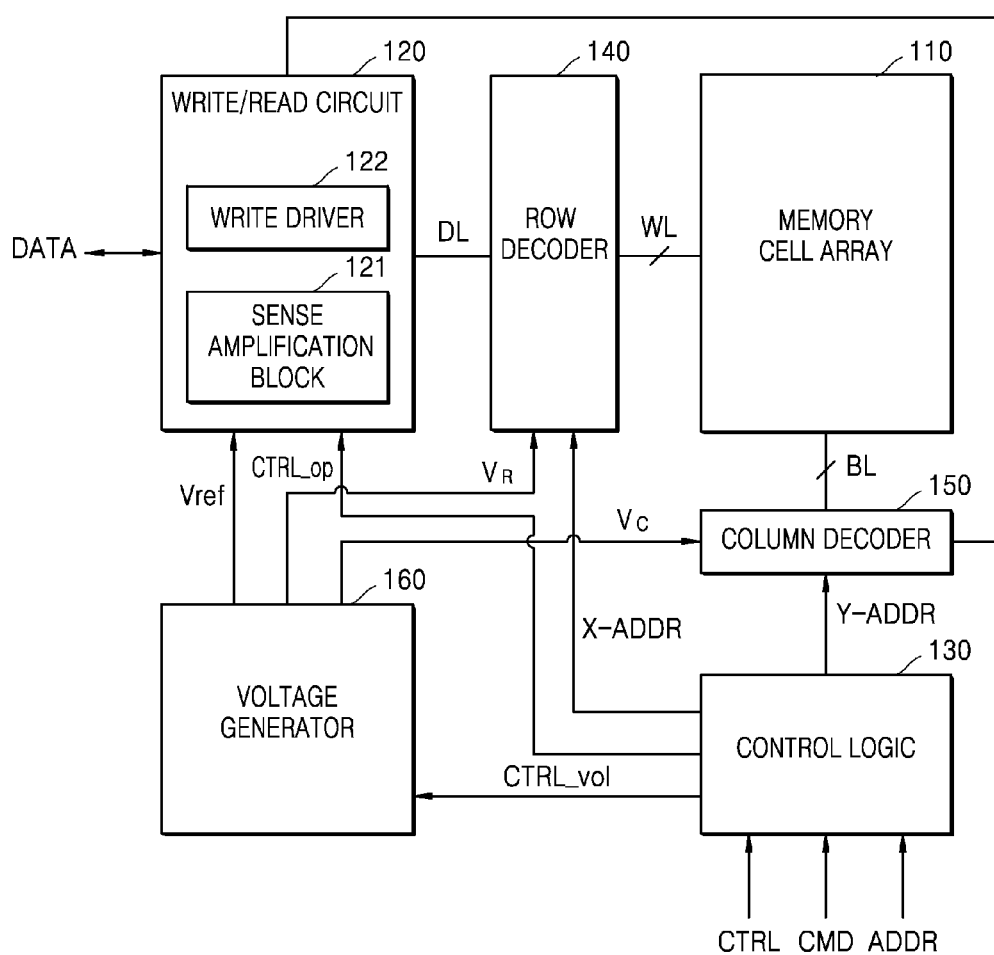
FIG. 2 illustrates a block diagram of a memory device in FIG. 1, according to embodiments of the inventive concepts.

FIG. 2 illustrates a block diagram of the memory device 100 of FIG. 1, according to embodiments of the inventive concepts.

Referring to FIG. 2, the memory device 100 may include a memory cell array 110, a write/read circuit 120, a control logic 130, a row decoder 140, a column decoder 150, and a voltage generator 160. Although not illustrated in FIG. 2, the memory device 100 may further include various other components related to memory operations, such as for example a data input/output circuit and/or an input/output interface.

The memory cell array 110 may be connected to a plurality of first signal lines and a plurality of second signal lines. Also, the memory cell array 110 may include a plurality of memory cells respectively arranged in regions where the plurality of first signal lines intersect with the plurality of second signal lines. Hereinafter, the case where the plurality of first signal lines are word lines WL and the plurality of second signal lines are bit lines BL will be described as an example.

The write/read circuit 120 may include a sense amplification block 121 and a write driver 122. The sense amplification block 121 may be selectively connected to a bit line BL and/or a word line WL and may read data written to the selected memory cell. For example, the sense amplification block 121 may detect a voltage from a word line WL connected to the selected memory cell, amplify the detected voltage, and output read data DATA. The write driver 122 may be selectively connected to a bit line BL and/or a word line WL and may provide a write pulse, for example, a write current, to the selected memory cell. As a result, the write driver 122 may program data DATA to be stored in the memory cell array 110.

The control logic 130 may output various control signals required for writing data to the memory cell array 110 or reading data from the memory cell array 110, based on the command CMD, the address ADDR, and the control signal CTRL received from the memory controller 200 in FIG. 1. Specifically, the control logic 130 may provide an operation select signal CTRL_op to the write/read circuit 120, provide a row address X_ADDR to the row decoder 140, provide a column address Y_ADDR to the column decoder 150, and provide a voltage control signal CTRL_vol to the voltage generator 160.

In an embodiment, during a write operation on a selected memory cell, the control logic 130 may select at least one unselected memory cell. For example, the control logic 130 may select at least one unselected memory cell based on a distance between the unselected memory cell and the selected memory cell. For example, the control logic 130 may select at least one unselected memory cell according to a set write operation and a reset write operation. In addition, in an embodiment, during a write operation on a selected memory cell, the control logic 130 may control a write pulse to be applied to the selected memory cell and a dummy pulse to be applied to the unselected memory cell. For example, the amplitude of the dummy pulse may be less than the amplitude of the write pulse. For example, the pulse width of the dummy pulse may be narrower than the pulse width of the write pulse.

The voltage generator 160 may generate various types of voltages required for performing write, read, and erase operations on the memory cell array 110 based on the voltage control signal CTRL_vol. For example, the voltage generator 160 may generate a first driving voltage $V_R$ for driving a plurality of word lines WL and a second driving voltage $V_C$ for driving a plurality of bit lines BL. For example, the voltage generator 160 may generate a reference voltage Vref and provide the generated reference voltage Vref to the write/read circuit 120.

The row decoder 140 may be connected to the write/read circuit 120 through a data line DL. The row decoder 140 may be connected to the memory cell array 110 through the plurality of word lines WL and may activate a selected word line among the plurality of word lines WL in response to the row address X_ADDR. The column decoder 150 may be connected to the memory cell array 110 through the plurality of bit lines BL and may activate a selected bit line among the plurality of bit lines BL in response to the column address Y_ADDR.

When the command CMD is a write command, the control logic 130 may provide a row address X_ADDR indicating a selected word line to the row decoder 140 and may provide a column address Y_ADDR indicating a selected bit line to the column decoder 150. In addition, the control logic 130 may provide a voltage control signal CTRL_vol to the voltage generator 160 to generate a write voltage and may provide an operation select signal CTRL_op instructing a write operation to the write/read circuit 120. Accordingly, a write pulse may be applied to a selected memory cell based on voltages applied to a selected word line and a selected bit line.

Subsequently, the control logic 130 may determine at least one unselected memory cell to which a dummy pulse is applied in order to reduce write disturb due to heat generated in the selected memory cell. When the command CMD is a reset write command, the number of unselected memory cells to which a dummy pulse is applied may be N. When the command CMD is a set write command, the number of unselected memory cells to which a dummy pulse is applied may be M. In this case, N and M are positive integers, and N may be greater than or equal to M.

Subsequently, the control logic 130 may provide a row address X_ADDR indicating a selected word line or an adjacent word line adjacent to the selected word line to the row decoder 140 and may provide a column address Y_ADDR indicating a selected bit line or an adjacent bit line adjacent to the selected bit line to the column decoder 150. In addition, the control logic 130 may provide the voltage control signal CTRL_vol to the voltage generator 160 to generate a voltage to be applied to an unselected memory cell and may provide the operation select signal CTRL_op indicating a dummy pulse application operation to the write/read circuit 120. Accordingly, a dummy pulse may be applied to the unselected memory cell based on a voltage applied to the selected word line, the adjacent word line, the selected bit line, or the adjacent bit line.

Figure 3:
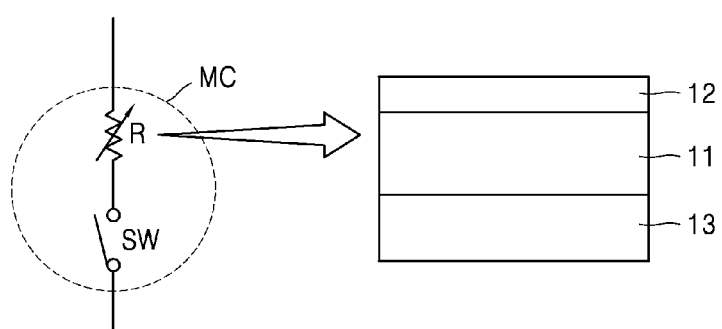
FIG. 3 illustrates a memory cell according to embodiments of the inventive concepts.

FIG. 3 illustrates a memory cell MC according to embodiments of the inventive concepts.

Referring to FIG. 3, the memory cell MC may include a variable resistor element R and a switching element SW. For example, the memory cell MC may be included in the memory cell array 110 of FIG. 2. The variable resistor element R may include a phase change layer 11 (or a variable resistance layer), an upper electrode 12 formed on the phase change layer 11, and a lower electrode 13 formed on the bottom of the phase change layer 11. For example, the variable resistor element R may include a phase change material (e.g., Ge—Sb—Te (GST)), a transition metal oxide, or a magnetic material. The switching element SW may be implemented using various elements such as for example an Ovonic threshold switching (OVS) material, a transistor, and a diode.

The upper and lower electrodes 12 and 13 may include various metals, metal oxides, or metal nitrides. The phase change layer 11 may include a bipolar resistance memory material or a unipolar resistance memory material. The bipolar resistance memory material may be programmed to a set or reset state by the polarity of a current, and perovskite-based materials may be used for the bipolar resistance memory material. The unipolar resistance memory material may be programmed to a set or reset state even with a current of the same polarity, and a transition metal oxide such as NiOx or TiOx may be used for the unipolar resistance memory material.

Figure 4A:
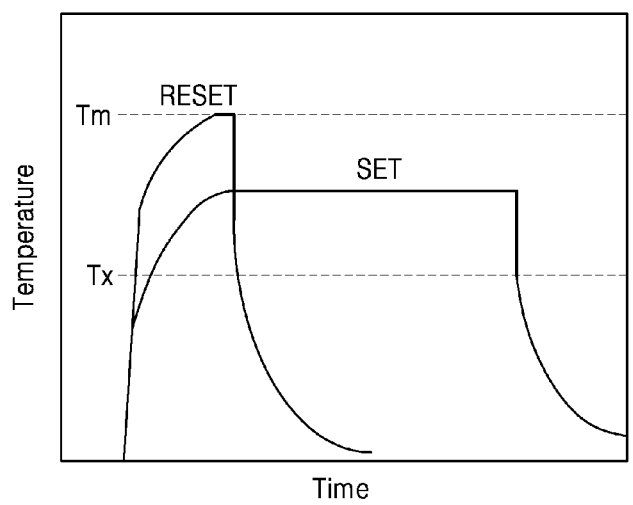
FIG. 4A illustrates a graph showing set write and reset write for a variable resistor element of the memory cell of FIG. 3.
Figure 4B:
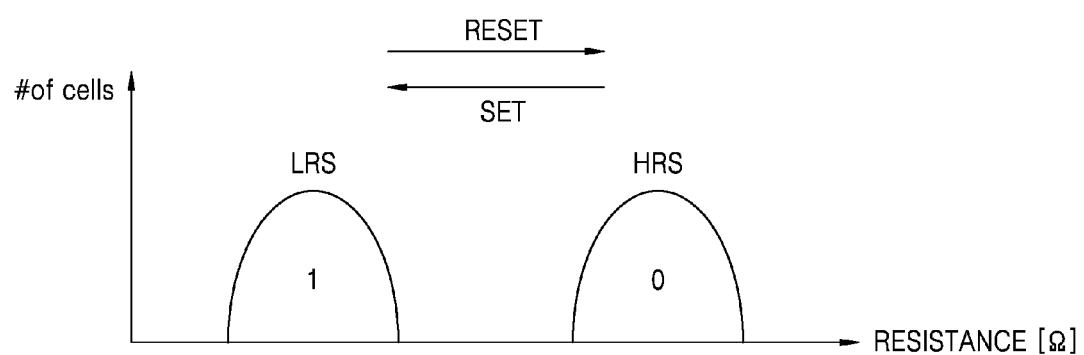
FIG. 4B illustrates a graph showing a distribution of memory cells according to resistance when the memory cell of FIG. 3 is a single level cell.

FIG. 4A illustrates a graph showing set write and reset write for the variable resistor element R of the memory cell MC of FIG. 3. FIG. 4B illustrates a graph showing a distribution of memory cells according to resistance when the memory cell MC of FIG. 3 is a single level cell.

Referring to FIGS. 3 and 4A together, the horizontal axis of the graph of FIG. 4A represents time and the vertical axis of the graph of FIG. 4A represents temperature. When a phase change material constituting the variable resistor element R is heated to a temperature between a crystallization temperature Tx and a melting point Tm for a certain period of time and then gradually cooled, the phase change material is in a crystalline state. This crystalline state is referred to as a 'set state' in which data '1' is stored. On the other hand, when the phase change material is quenched after being heated to a temperature above the melting point Tm, the phase change material is in an amorphous state. This amorphous state is referred to as a 'reset state' in which data '0' is stored. Therefore, a current may be supplied to the variable resistor element R to store data, and the resistance value of the variable resistor element R may be measured to read data.

Referring to FIGS. 3 and 4B together, the horizontal axis of the graph of FIG. 4B represents resistance and the vertical axis of the graph of FIG. 4B represents the number of memory cells MC. When the memory cell MC is a single level cell, the memory cell MC may be in one of a low resistance state LRS, that is, a set state SET, and a high resistance state HRS, that is, a reset state RESET. Accordingly, the operation of switching the memory cell MC from the low resistance state LRS to the high resistance state HRS may be referred to as a reset operation or a reset write operation. In addition, the operation of switching the memory cell MC from the high resistance state HRS to the low resistance state LRS may be referred to as a set operation or a set write operation.

Figure 5A:
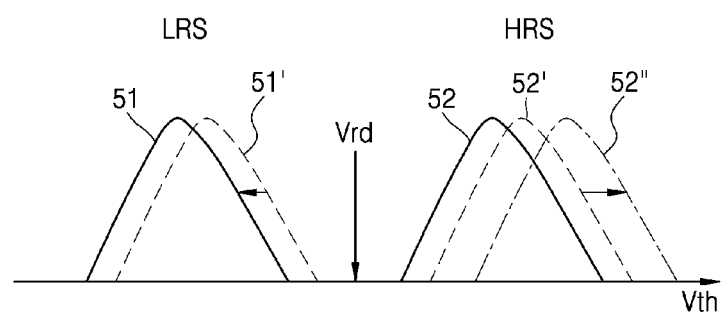
FIG. 5A illustrates a graph showing a threshold voltage distribution of selected memory cells.

FIG. 5A illustrates a graph showing a threshold voltage distribution of selected memory cells.

Referring to FIG. 5A, the horizontal axis of the graph represents the threshold voltage and the vertical axis (not shown) of the graph represents the number of memory cells. By a set write operation, the selected memory cells may have an initial set distribution 51 in a set state. In addition, by a reset write operation, the selected memory cells may have an initial reset distribution 52 in a reset state. However, the threshold voltage of the memory cells may increase as time elapses after the set write operation and the reset write operation, and accordingly, the initial set distribution 51 and the initial reset distribution 52 may shift to the right and thus the memory cells may have a first set distribution 51' and a first reset distribution 52'. A phenomenon in which the threshold voltage increases over time as described above is referred to as "drift".

In this case, when a read pulse, for example, a read voltage Vrd, is applied to memory cells having the first set distribution 51', the memory cells having the first set distribution 51' may be turned on and the drift of the turned on memory cells may be initiated and thus the threshold voltage of the memory cells may be reduced. Accordingly, the memory cells may have the initial set distribution 51 again. Meanwhile, when a read pulse, for example, a read voltage Vrd is applied to memory cells having the first reset distribution 52', the memory cells having the first reset distribution 52' may be turned off and the drift of the turned off memory cells may be further accelerated and thus the threshold voltage of the memory cells may further increase. Accordingly, the memory cells may have a second reset distribution 52". As described above, by applying the read voltage Vrd, the memory cells may have the initial set distribution 51 or the second reset distribution 52", and thus, a read window between the set state and the reset state may increase.

Figure 5B:
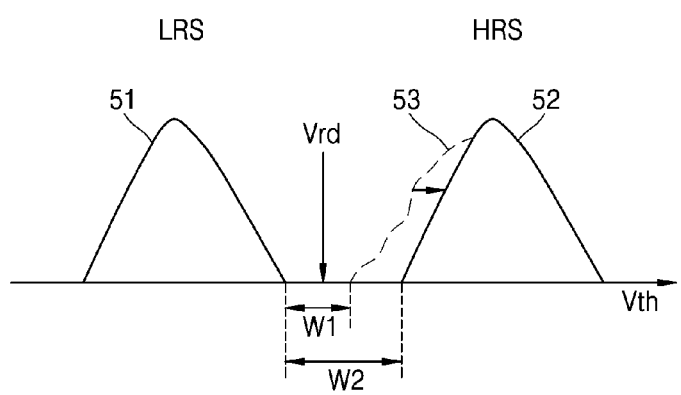
FIG. 5B illustrates a graph showing a threshold voltage distribution of unselected memory cells.

FIG. 5B illustrates a graph showing a threshold voltage distribution of unselected memory cells.

FIG. 5B, the horizontal axis of the graph represents the threshold voltage, and the vertical axis (not shown) of the graph represents the number of memory cells. When a set write operation and a reset write operation are performed on selected memory cells, a threshold voltage distribution of unselected memory cells adjacent to the selected memory cells may also be changed due to heat generated in the set write operation and the reset write operation on the selected memory cells.

In an embodiment, memory cells in a set state among the adjacent unselected memory cells may be hardly affected by heat generated in a write operation on the selected memory cells and may have an initial set distribution 51. On the other hand, due to the heat generated in the write operation on the selected memory cells, a threshold voltage distribution of memory cells in a reset state among the adjacent unselected memory cells may droop to be like a third reset distribution 53. In other words, a droop may occur in a threshold voltage distribution of memory cells in a reset state. As a result, a read window between the initial set distribution 51 and the third reset distribution 53 may narrow to a first window W1. In an embodiment, the threshold voltage of memory cells having an initial set distribution 51 among the adjacent unselected memory cells may increase due to heat generated in a write operation on the selected memory cells. In this case, the read window may be further reduced than the first window W1.

In this case, when a read pulse, for example, a read voltage Vrd is applied to the unselected memory cells, memory cells in a reset state may be turned off, and the drift of the turned off memory cells may be further accelerated and thus the threshold voltage of the memory cells may further increase. Accordingly, the threshold voltage distribution of the memory cells may be restored to the initial reset distribution 52. In addition, when a read pulse, for example, a read voltage Vrd, is applied to the unselected memory cells, memory cells in a set state may be turned on and the drift of the turned on memory cells may be initialized and thus the threshold voltage of the memory cells may decrease. As described above, by applying the read voltage Vrd, a read window between the set state and the reset state may be widened to a second window W2.

Figure 6:
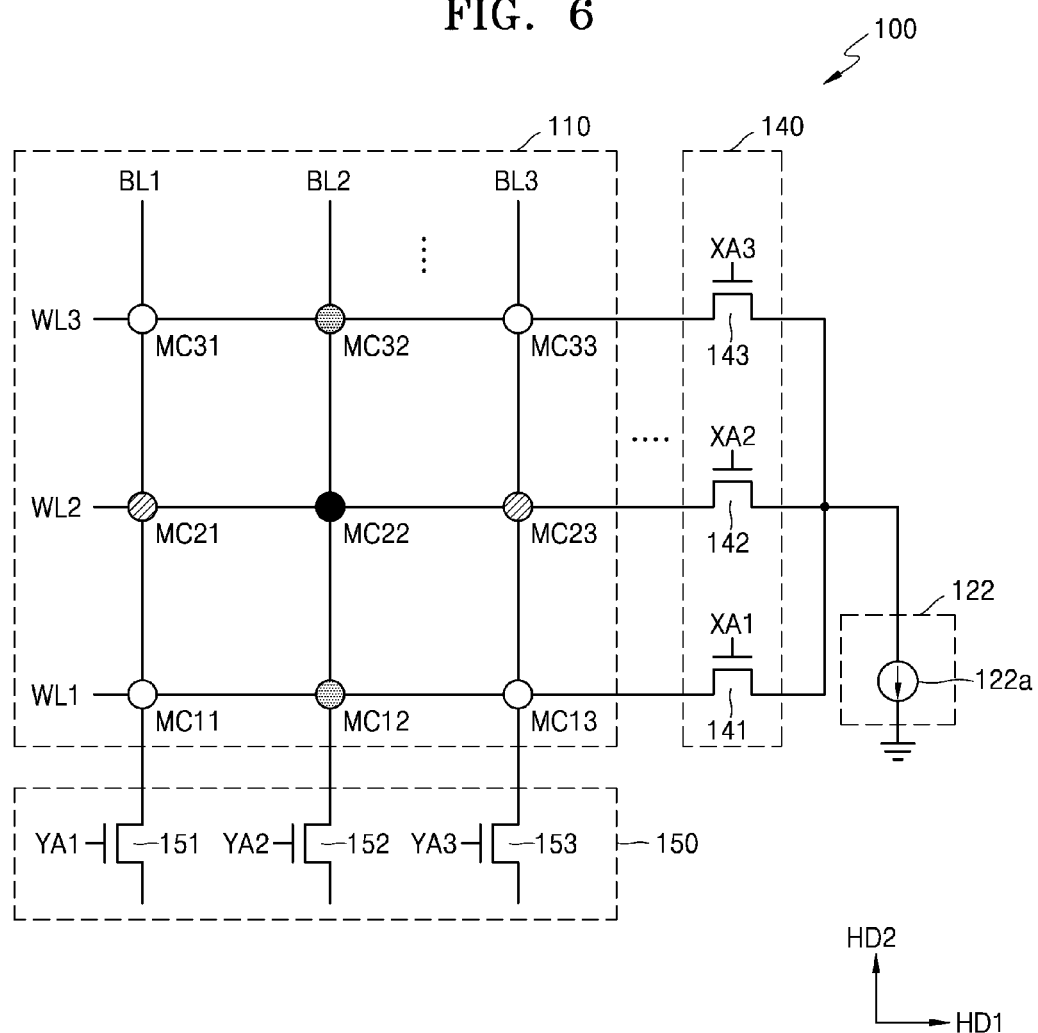
FIG. 6 illustrates a portion of the memory device of FIG. 2 in more detail, according to embodiments of the inventive concepts.

FIG. 6 illustrates a portion of the memory device 100 of FIG. 2 in more detail, according to an embodiment of the inventive concept.

Referring to FIG. 6, a memory cell array 110 may include first to third word lines WL1 to WL3 extending in a first horizontal direction HD1, first to third bit lines BL1 to BL3 extending in a second horizontal direction HD2, and a plurality of memory cells MC11 to MC33 respectively arranged in regions where the first to third bit lines BL1 to BL3 intersect with the first to third word lines WL1 to WL3. For example, a selected bit line may be the second bit line BL2 and a selected word line may be the second word line WL2, and thus, a selected memory cell may be the memory cell MC22.

Each of the plurality of memory cells MC11 to MC33 may include, for example, a variable resistance element R and a switching element SW, as illustrated in FIG. 3. Hereinafter, the memory cell array 110 will be described with reference to FIGS. 3 and 6 together. In an embodiment, the variable resistance element R may be connected between one of the first to third word lines WL1 to WL3 and the switching element SW, and the switching element SW may be connected between the variable resistance element R and one of the third bit lines BL1 to BL3. However, the inventive concepts are not limited thereto, and in other embodiments the variable resistance element R may be connected between one of the first to third bit lines BL1 to BL3 and the switching element SW, and the switching element SW may be connected between the variable resistor element R and one of the first to third word lines WL1 to WL3.

The switching element SW may control current supply to the variable resistor element R according to voltages applied to a word line and a bit line which are connected to the switching element SW. For example, the switching element SW may be implemented with an Ovonic Threshold Switching (OTS) material. However, the inventive concepts are not limited thereto, and in other embodiments the switching element SW may be changed to other switchable elements such as for example a unidirectional diode, a bidirectional diode, and a transistor.

A voltage may be applied to the variable resistor element R of each of the plurality of memory cells MC11 to MC33 through the first to third word lines WL1 to WL3 and the first to third bit lines BL1 to BL3, and thus, a current may flow through the variable resistor element R. For example, the variable resistor element R may include a layer of phase change material that may reversibly transition between a first state and a second state. However, the variable resistor element R is not limited thereto and may include any variable resistor having a resistance value that varies depending on an applied voltage. For example, in each of the plurality of memory cells MC11 to MC33, the resistance of the variable resistor element R may reversibly transition between the first state and the second state depending on a voltage applied to the variable resistor element R.

A row decoder 140 may be arranged between the memory cell array 110 and a write driver 122 and may include row switches 141 to 143 respectively connected to the first to third word lines WL1 to WL3. In an embodiment, the row switches 141 to 143 may be turned on or off according to row addresses XA1 to XA3 respectively corresponding thereto, and accordingly, the row decoder 140 may select one of the first to third word lines WL1 to WL3.

A column decoder 150 may include column switches 151 to 153 respectively connected to the first to third bit lines BL1 to BL3. The column switches 151 to 153 may be turned on or off according to column addresses YA1 to YA3 respectively corresponding thereto, and accordingly, the column decoder 150 may select one of the first to third bit lines BL1 to BL3.

The write driver 122 may include at least one current source 122a connected to the row decoder 140. The current source 122a may be connected to a selected word line among the first to third word lines WL1 to WL3 and provide a write pulse to the selected word line. In an embodiment, during a write operation on a selected memory cell, for example, the memory cell MC22, the row switch 142 and the column switch 152 may be turned on, and accordingly, the write driver 122 may provide a write pulse to the memory cell MC22 through the second word line WL2. Subsequently, the write driver 122 may provide a dummy pulse to at least one of unselected memory cells adjacent to the selected memory cell MC22.

In an embodiment, the write driver 122 may include one current source 122a, and the current source 122a may sequentially provide dummy pulses to a plurality of unselected memory cells. For example, the row switch 141 and the column switch 152 may be turned on, and accordingly, the current source 122a may provide a dummy pulse to the memory cell MC12 through the first word line WL1. Subsequently, for example, the row switch 143 and the column switch 152 may be turned on, and accordingly, the current source 122a may provide a dummy pulse to the memory cell MC32 through the third word line WL3. Subsequently, for example, the row switch 142 and the column switch 151 may be turned on, and accordingly, the current source 122a may provide a dummy pulse to the memory cell MC21 through the second word line WL2. Subsequently, for example, the row switch 142 and the column switch 153 may be turned on, and accordingly, the current source 122a may provide a dummy pulse to the memory cell MC23 through the second word line WL2.

However, the inventive concepts are not limited thereto, and in some embodiments the write driver 122 may include a plurality of current sources, and the plurality of current sources may provide dummy pulses in parallel to a plurality of unselected memory cells. For example, the row switches 141 and 143 and the column switch 152 may be turned on, and accordingly, the plurality of current sources may respectively provide dummy pulses to the memory cells MC12 and MC32 through the first and third word lines WL1 and WL3. Subsequently, for example, the row switch 142 and the column switch 151 may be turned on, and accordingly, one of the plurality of current sources may provide a dummy pulse to the memory cell MC21 through the second word line WL2. Subsequently, for example, the row switch 142 and the column switch 153 may be turned on, and accordingly, one of the plurality of current sources may provide a dummy pulse to the memory cell MC23 through the second word line WL2.

FIG. 7 illustrates applied voltages for a plurality of cell groups, according to embodiments of the inventive concepts.

Referring to FIGS. 6 and 7 together, unselected memory cells adjacent to the selected memory cell MC22 may be divided into a plurality of cell groups. For example, the unselected memory cells adjacent to the selected memory cell MC22 may be divided into first to third cell groups GR1, GR2, and GR3 based on a distance between each of the unselected memory cells and the selected memory cell MC22. Due to heat generated in the selected memory cell MC22 to which a write pulse is applied, the narrower (i.e., the shorter) the distance between the unselected memory cell and the selected memory cell MC22, the larger a write disturb to the unselected memory cell. Accordingly, the narrower (i.e., the shorter) the distance between the unselected memory cell and the selected memory cell MC22, the more the distribution of the unselected memory cell may droop, and thus, compensation for this is necessary.

In an embodiment, a distance between memory cells connected to the same bit line may be narrower (i.e., shorter) than a distance between memory cells connected to the same word line. Accordingly, the first cell group GR1 may include adjacent memory cells connected to the second bit line BL2, that is the memory cells MC32 and MC12 adjacent to the memory cell MC22 in the second horizontal direction HD2, and a first voltage V1 may be applied to the memory cells MC32 and MC12. In addition, the second cell group GR2 may include adjacent memory cells connected to the second word line WL2, that is the memory cells MC21 and MC23 adjacent to the memory cell MC22 in the first horizontal direction HD1, and a second voltage V2 may be applied to the memory cells MC21 and MC23. Furthermore, the third cell group GR3 may include the memory cells MC11, MC13, MC31, and MC33 arranged diagonally with respect to the memory cell MC22, and a third voltage V3 may be applied to the memory cells MC11, MC13, MC31, MC33. The distances between the memory cells of the first cell group GR1 and the memory cell MC22 are narrower (i.e., shorter) than the distances between the memory cells of the second cell group GR2 and the memory cell MC22, and the distances between the memory cells of the second cell group GR2 and the memory cell MC22 are narrower (i.e., shorter) than the distances between the memory cells of the third cell group GR3 and the memory cell MC22.

Figure 8:
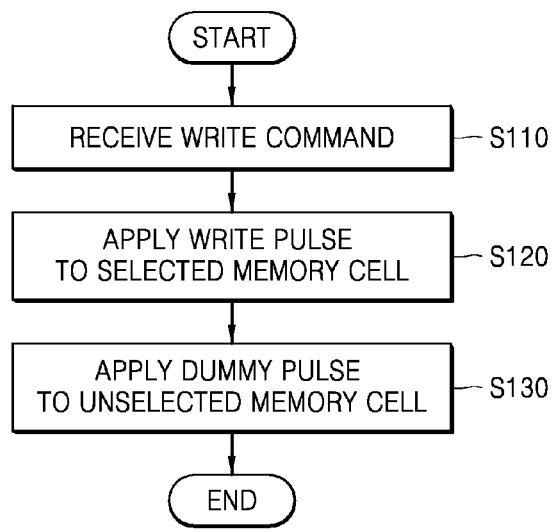
FIG. 8 illustrates a flowchart of a method of programming a memory device, according to embodiments of the inventive concepts.

FIG. 8 illustrates a flowchart of a method of programming a memory device, according to embodiments of the inventive concepts.

Referring to FIG. 8, the method corresponds to an operation of writing data in a memory device according to a write request from a host. For example, the method may include operations performed in a time series in the memory device 100 of FIG. 1. For example, the memory controller 200 may provide a write command or a program command to the memory device 100 according to a request from the host. Hereinafter, the method of programming a memory device will be described with reference to FIGS. 6 to 8 together.

In operation S110, the memory device 100 (e.g., the control logic 130) receives a write command and decodes an address provided with the write command to determine a selected memory cell. The write command may be a set write command or a reset write command. For example, the selected memory cell may be the memory cell MC22 arranged in a region where the second bit line BL2 intersects with the second word line WL2. Hereinafter, the memory cell MC22 will be referred to as a selected memory cell MC22.

In operation S120, the memory device 100 applies a write pulse to the selected memory cell MC22. For example, the write driver 122 may apply a write pulse (e.g., a write pulse WP in FIG. 9A) to the selected memory cell MC22 through the second word line WL2. For example, in response to a set write command, the write driver 122 may apply a set write pulse to the selected memory cell MC22. For example, in response to a reset write command, the write driver 122 may apply a reset write pulse to the selected memory cell MC22. For example, the application time of the set write pulse may be greater than the application time of the reset write pulse. For example, the amplitude of the set write pulse may be less than the amplitude of the reset write pulse.

In operation S130, the memory device 100 applies a dummy pulse to an unselected memory cell. In an embodiment, the memory device 100 may apply a first dummy pulse (e.g., a dummy pulse DP1 in FIG. 9A) to unselected memory cells in the first cell group GR1. For example, the row switch 141 and the column switch 152 may be turned on, and accordingly, the write driver 122 may apply a first dummy pulse to the memory cell MC12, which is an unselected memory cell, through the first word line WL1. Subsequently, for example, the row switch 143 and the column switch 152 may be turned on, and accordingly, the write driver 122 may apply a first dummy pulse to the memory cell MC32, which is an unselected memory cell, through the third word line WL3.

In an embodiment, the memory device 100 may apply a second dummy pulse (e.g., a second dummy pulse DP2 in FIG. 9A) to unselected memory cells in the second cell group GR2. For example, after a first dummy pulse application operation on the first cell group GR1, a second dummy pulse application operation on the second cell group GR2 may be performed. As another example, the first dummy pulse application operation on the first cell group GR1 and the second dummy pulse application operation on the second cell group GR2 may be performed in parallel. For example, the first and second dummy pulse application operations may be performed sequentially or in parallel depending on the number of current sources 122a in the memory device 100.

For example, the first cell group GR1 may include a plurality of first memory cells, and the second cell group GR2 may include a plurality of second memory cells. In an embodiment, the first dummy pulse may be sequentially applied to the plurality of first memory cells, and the second dummy pulse may be sequentially applied to the plurality of second memory cells. In an embodiment, the first dummy pulse may be applied in parallel to the plurality of first memory cells, and the second dummy pulse may be applied in parallel to the plurality of second memory cells.

Figure 9A:
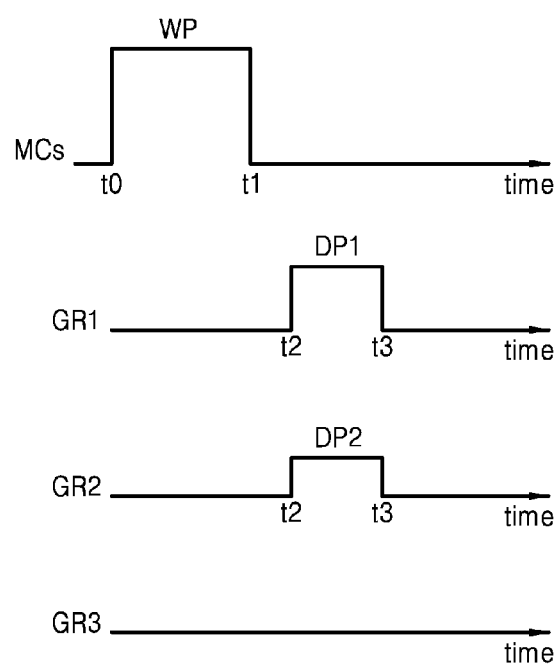
FIGS. 9A, 9B and 9C illustrate a write pulse applied to a selected memory cell and dummy pulses applied to unselected memory cells, according to embodiments of the inventive concepts.

FIG. 9A illustrates a write pulse WP applied to a selected memory cell MCs and dummy pulses DP1 and DP2 applied to unselected memory cells, according to embodiments of the inventive concepts.

Referring to FIG. 9A, from a time t0 to a time t1, the write pulse WP may be applied to the selected memory cell MCs. For example, the write pulse WP may be a set write current or a reset write current. The pulse width of the set write current may be greater than the pulse width of the reset write current. The amplitude of the set write pulse may be less than the amplitude of the reset write pulse.

Subsequently, a first dummy pulse DP1 may be applied to unselected memory cells in the first cell group GR1 from a time t2 to a time t3. For example, the application time of the first dummy pulse DP1 may be shorter than the application time of the write pulse WP. In other words, a time period from the time t2 to the time t3 may be shorter than a time period from the time t0 to the time t1. For example, the amplitude of the first dummy pulse DP1 may be less than the amplitude of the write pulse WP.

From the time t2 to the time t3, the second dummy pulse DP2 may be applied to unselected memory cells in the second cell group GR2. For example, the application time of the second dummy pulse DP2 may be substantially the same as the application time of the first dummy pulse DP1. For example, the amplitude of the second dummy pulse DP2 may be less than the amplitude of the first dummy pulse DP1. However, the inventive concepts are not limited thereto, and in some embodiments, after the first dummy pulse DP1 is applied to unselected memory cells in the first cell group GR1, the second dummy pulse DP2 may be applied to unselected memory cells in the second cell group GR2.

As further shown in FIG. 9A, a dummy pulse is not applied to unselected memory cells in the third cell group GR3. However, the inventive concepts are not limited thereto, and in some embodiments a third dummy pulse having a shorter application time than the second dummy pulse DP2 or a third dummy pulse having a smaller amplitude than the second dummy pulse DP2 may be applied to unselected memory cells in the third cell group GR3.

Figure 9B:
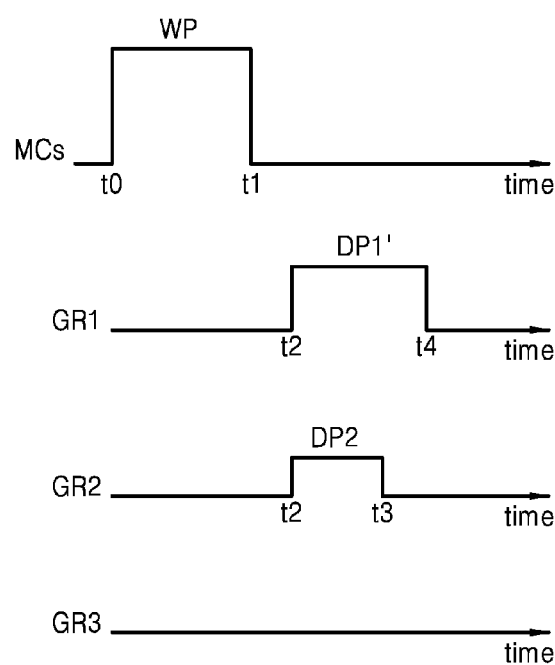

FIG. 9B illustrates a write pulse WP applied to a selected memory cell MCs and dummy pulses DP1' and DP2 applied to unselected memory cells, according to embodiments of the inventive concepts.

Referring to FIG. 9B which shows a modification of the embodiment of FIG. 9A, the application time of a first dummy pulse DP1' in FIG. 9B may be different from the application time of the first dummy pulse DP in FIG. 9A. Specifically, from a time t2 to a time t4, the first dummy pulse DP1' may be applied to unselected memory cells in the first cell group GR1. For example, the application time of the first dummy pulse DP1' in FIG. 9B may be greater than the application time of the first dummy pulse DP1 in FIG. 9A. For example, the amplitude of the first dummy pulse DP' may be substantially the same as the amplitude of the first dummy pulse DP1 in FIG. 9A. In some embodiments, after the first dummy pulse DP1' is applied to unselected memory cells in the first cell group GR1, a second dummy pulse DP2 may be applied to unselected memory cells in the second cell group GR2.

Figure 9C:
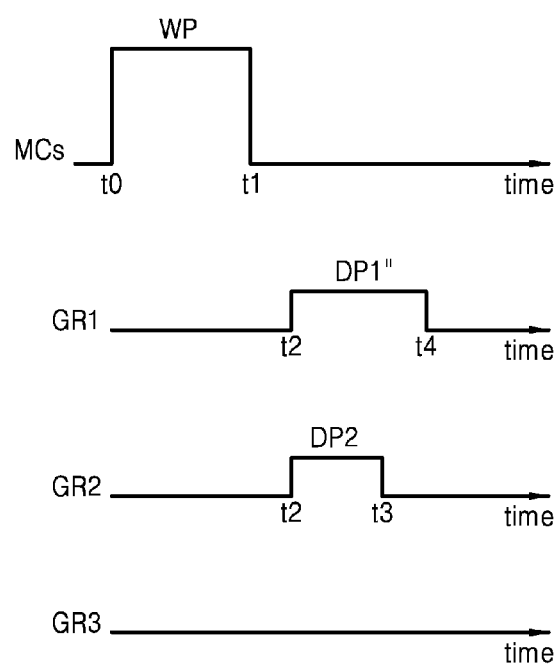

FIG. 9C illustrates a write pulse WP applied to a selected memory cell MCs and dummy pulses DP1" and DP2 applied to unselected memory cells, according to embodiments of the inventive concepts.

Referring to FIG. 9C which shows a modification of the embodiment of FIG. 9B, the amplitude of a first dummy pulse DP1" in FIG. 9C may be different from the amplitude of the first dummy pulse DP1' in FIG. 9B. Specifically, from a time t2 to a time t4, the first dummy pulse DP1" may be applied to unselected memory cells in the first cell group GR1. For example, the amplitude of the first dummy pulse DP1" may be less than the amplitude of the first dummy pulse DP1' in FIG. 9B. For example, the application time of the first dummy pulse DP1" may be substantially the same as the application time of the first dummy pulse DP1' in FIG. 9B. In some embodiments, after the first dummy pulse DP1" is applied to unselected memory cells in the first cell group GR1, a second dummy pulse DP2 may be applied to unselected memory cells in the second cell group GR2.

Figure 10:
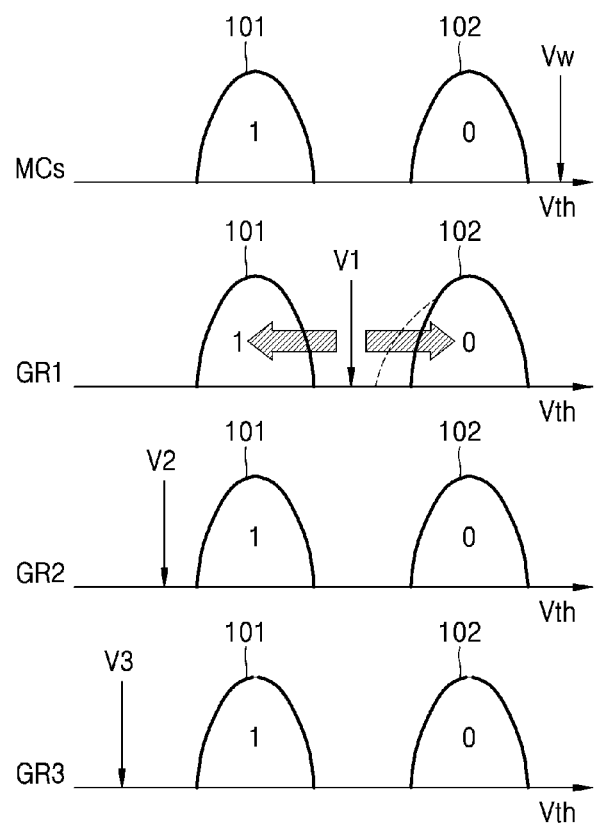
FIG. 10 illustrates a threshold voltage distribution for a selected memory cell and threshold voltage distributions for unselected memory cells, according to embodiments of the inventive concepts.

FIG. 10 illustrates a threshold voltage distribution for a selected memory cell MCs and threshold voltage distributions for unselected memory cells, according to embodiments of the inventive concepts.

Referring to FIGS. 6, 7, and 10 together, by performing a write operation on the selected memory cell MCs, the selected memory cell MCs may have a set distribution 101 or a reset distribution 102. During the write operation on the selected memory cell MCs, a voltage across the selected memory cell MCs may correspond to a write voltage Vw. In this case, the voltage across the selected memory cell MCs may correspond to a difference between a voltage applied to a selected bit line and a voltage applied to a selected word line. For example, the voltage level of the write voltage Vw may be higher than the upper limit level of the reset distribution 102.

For example, the voltage level of the write voltage Vw applied during a reset write operation may be higher than the voltage level of the write voltage Vw applied during a set write operation. The selected memory cell MCs may be turned on by the write voltage Vw, and thus, a write operation may be performed on the selected memory cell MCs. For example, a voltage applied to the first and third bit lines BL1 and BL3 may be 0 volts (V), and a voltage applied to the first and third word lines WL1 and WL3 may be 0 V. Accordingly, voltages across unselected memory cells may be 0 V, and the unselected memory cells may be turned off and thus a write operation may not be performed on the unselected memory cells.

After the write pulse WP is applied to the selected memory cell MCs, voltages across unselected memory cells in the first cell group GR1 may correspond to a first voltage V1. The voltage level of the first voltage V1 may be lower than the voltage level of the write voltage Vw. For example, a voltage applied to the second bit line BL2 may be 2 V and a voltage applied to the first and third word lines WL1 and WL3 may be −2 V, and accordingly, voltages across the memory cells MC12 and MC32 may be 4 V. Due to heat generated when the write pulse WP is applied to the selected memory cell MCs, a threshold voltage distribution of memory cells in a reset state among the unselected memory cells in the first cell group GR1 may droop as indicated by the dashed line in FIG. 10. However, in an embodiment, by applying a first dummy pulse (e.g., the dummy pulse DP1 in FIG. 9A) to unselected memory cells in the first cell group GR1 while voltages across the unselected memory cells in the first cell group GR1 maintain the first voltage V1, a reset distribution of the unselected memory cells in the first cell group GR1 may shift to the right as shown in FIG. 10 to have an initial reset distribution 102 again, and accordingly, a read window may be secured.

After the write pulse WP is applied to the selected memory cell MCs, voltages across unselected memory cells in the second cell group GR2 may correspond to a second voltage V2. The voltage level of the second voltage V2 may be lower than the voltage level of the first voltage V1. For example, the voltage level of the second voltage V2 may be lower than the lower limit level of a set distribution. For example, a voltage applied to the first and third bit lines BL1 and BL3 may be 0 V and a voltage applied to the second word line WL2 may be −2 V, and accordingly, voltages across the memory cells MC21 and MC23 may be 2 V. A threshold voltage distribution of unselected memory cells in the second cell group GR2 may not be substantially affected by heat generated when the write pulse WP is applied to the selected memory cell MCs.

After the write pulse WP is applied to the selected memory cell MCs, voltages across unselected memory cells in the third cell group GR3 may correspond to a third voltage V3. The voltage level of the third voltage V3 may be lower than the voltage level of the second voltage V2. For example, a voltage applied to the first and third bit lines BL1 and BL3 may be 0 V and a voltage applied to the first and third word lines WL1 and WL3 may be 0 V, and accordingly, voltages across the memory cells MC11, MC13, MC31, and MC33 may be 0 V. A threshold voltage distribution of unselected memory cells in the third cell group GR2 may not be substantially affected by heat generated when the write pulse WP is applied to the selected memory cell MCs.

Figure 11:
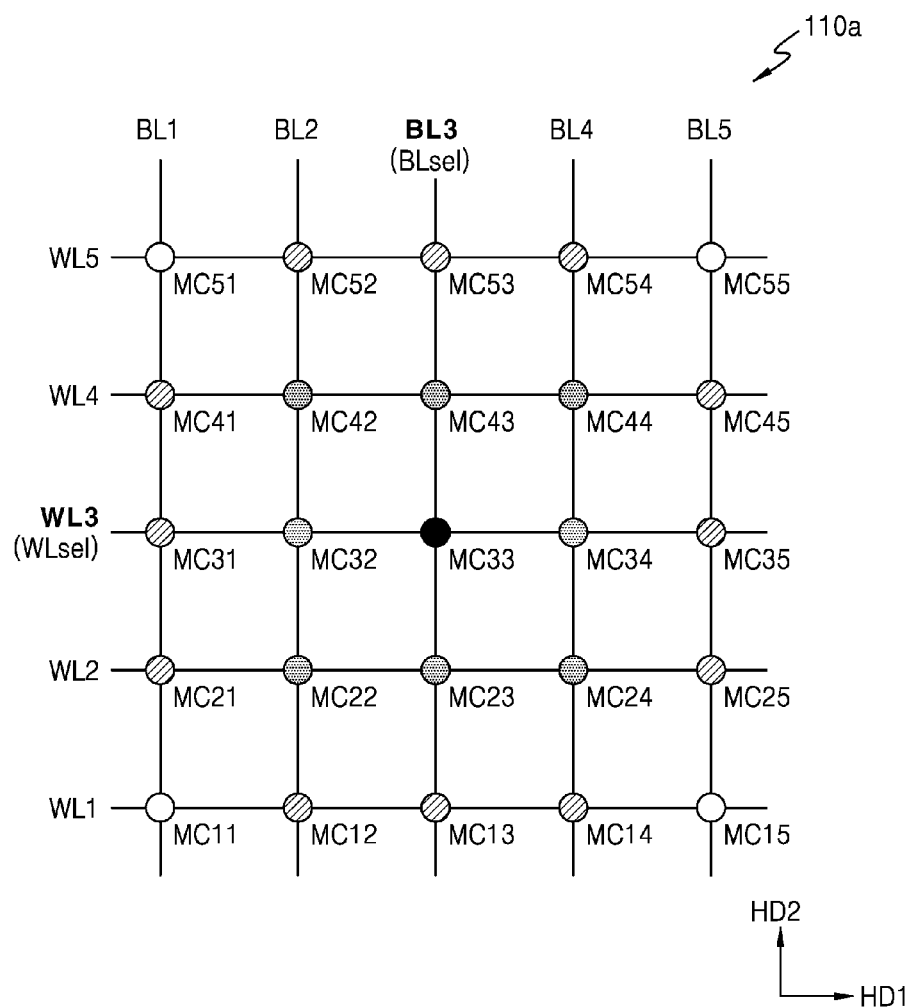
FIG. 11 illustrates a memory cell array according to embodiments of the inventive concepts.

FIG. 11 illustrates a memory cell array 110a according to embodiments of the inventive concepts. FIG. 12 illustrates applied voltages for memory cells illustrated in FIG. 11, according to embodiments of the inventive concepts.

Referring to FIGS. 11 and 12 together, the memory cell array 110a may include first to fifth word lines WL1 to WL5 extending in a first horizontal direction HD1, first to fifth bit lines BL1 to BL5 extending in a second horizontal direction HD2, and a plurality of memory cells MC11 to MC55. For example, a selected bit line (BLsel) may be the third bit line BL3 and a selected word line (WLsel) may be the third word line WL3, and accordingly, a selected memory cell may be the memory cell MC33.

For example, a first cell group GR1 may include adjacent memory cells MC23 and MC43 connected to the third bit line BL3, which is the same bit line connected to the selected memory cell MC33, adjacent memory cells MC32 and MC34 connected to the third word line WL3, which is the same word line connected to the selected memory cell MC33, and memory cells MC22, MC24, MC42, and MC44 diagonally adjacent to the selected memory cell MC33. Voltages across the memory cells in the first cell group GR1 may correspond to a first voltage V1.

For example, a second cell group GR2 may include non-adjacent memory cells MC13 and MC53 connected to the third bit line BL3, which is the same bit line connected to the selected memory cell MC33, non-adjacent memory cells MC31 and MC35 connected to the third word line WL3, which is the same word line connected to the selected memory cell MC33, non-adjacent memory cells MC12, MC14, MC52, and MC54 connected to the second and fourth bit lines BL2 and BL4 adjacent to the third bit line BL3, which is a selected bit line, and non-adjacent memory cells MC21, MC25, MC41, and MC45 connected to the second and fourth word lines WL2 and WL4 adjacent to the third word line WL3, which is a selected word line. Voltages across the memory cells in the second cell group GR2 may correspond to a second voltage V2.

For example, a third cell group GR3 may include memory cells MC11, MC15, MC51, and MC55 arranged in regions where the first and fifth bit lines BL1 and BL5, which are not adjacent to the third bit line BL3, which is a selected bit line, intersect with the first and fifth word lines WL1 and WL5, which are not adjacent to the third word line WL3, which is a selected word line. Voltages across the memory cells in the third cell group GR3 may correspond to a third voltage V3.

Figure 13:
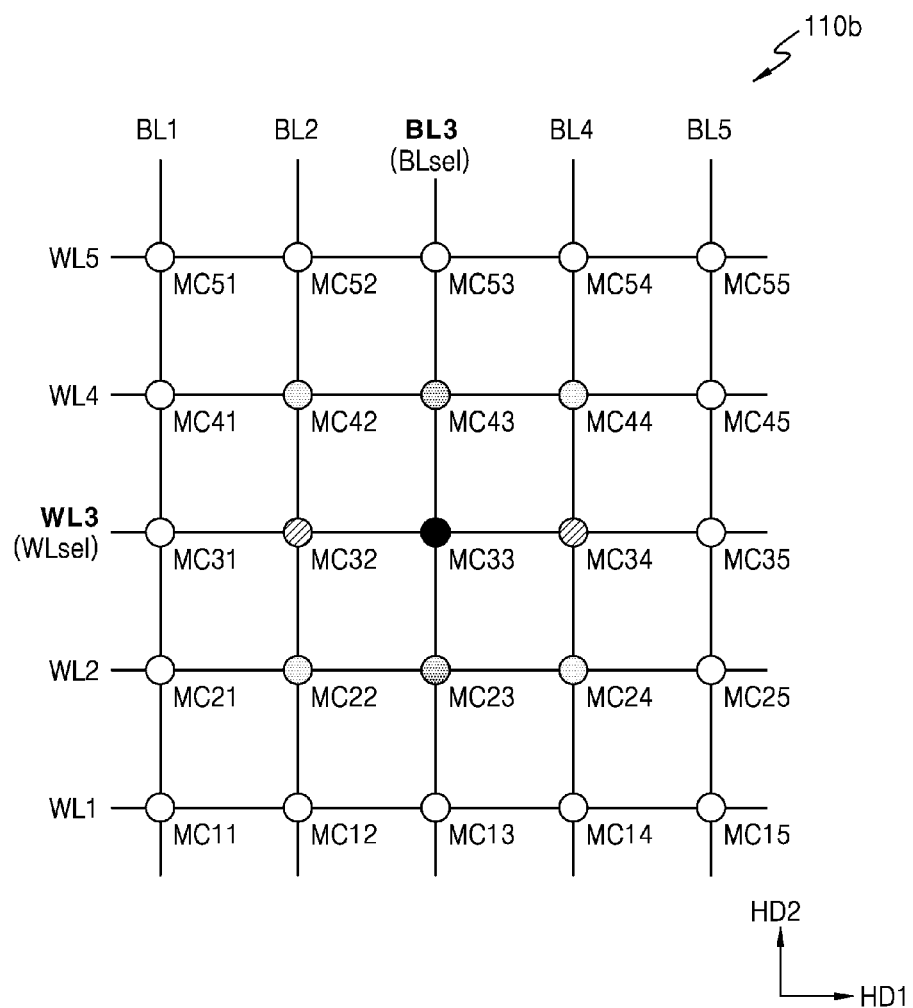
FIG. 13 illustrates a memory cell array according to embodiments of the inventive concepts.

FIG. 13 illustrates a memory cell array 110b according to embodiments of the inventive concepts. FIG. 14 illustrates applied voltages for memory cells illustrated in FIG. 13, according to embodiments of the inventive concepts 1.

Referring to FIGS. 13 and 14 together, the memory cell array 110b may include first to fifth word lines WL1 to WL5 extending in a first horizontal direction HD1, first to fifth bit lines BL1 to BL5 extending in a second horizontal direction HD2, and a plurality of memory cells MC11 to MC55. For example, a selected bit line (BLsel) may be the third bit line BL3 and a selected word line (WLsel) may be the third word line WL3, and accordingly, a selected memory cell may be the memory cell MC33.

For example, a first cell group GR1 may include adjacent memory cells MC23 and MC43 connected to the third bit line BL3, which is the same bit line connected to the selected memory cell MC33. Voltages across the memory cells in the first cell group GR1 may correspond to a first voltage V1. For example, a second cell group GR2 may include adjacent memory cells MC32 and MC34 connected to the third word line WL3, which is the same word line connected to the selected memory cell MC33. Voltages across the memory cells in the second cell group GR2 may correspond to a second voltage V2.

For example, a third cell group GR3 may include memory cells MC22, MC24, MC42, and MC44 diagonally adjacent to the selected memory cell MC33. Voltages across the memory cells in the third cell group GR3 may correspond to a third voltage V3. For example, memory cells not included in the first to third cell groups GR1 to GR3 may be included in a fourth cell group GR4, and voltages across the memory cells in the fourth cell group GR4 may correspond to a fourth voltage V4.

Figure 15:
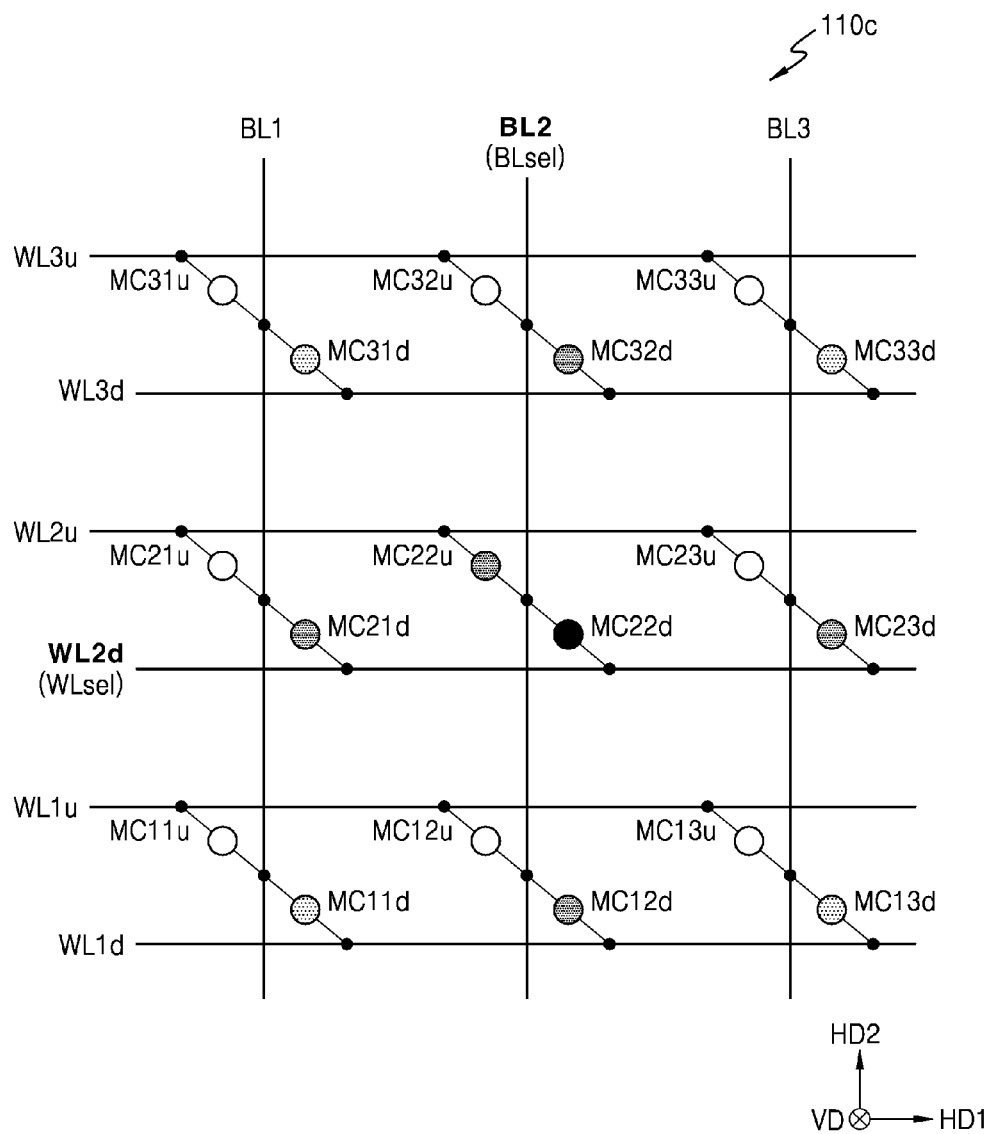
FIG. 15 illustrates a memory cell array according to embodiments of the inventive concepts.

FIG. 15 illustrates a memory cell array 110c according to embodiments of the inventive concepts. FIG. 16 illustrates applied voltages for memory cells illustrated in FIG. 15, according to embodiments of the inventive concepts.

Referring to FIGS. 15 and 16 together, the memory cell array 110c may include first to third lower word lines WL1d to WL3d (i.e., WL1d, WL2d and WL3d), first to third upper word lines WL1u to WL3u (i.e., WL1u, WL2u and WL3u), and first to third bit lines BL1 to BL3. The first to third lower word lines WL1d to WL3d may extend in a first horizontal direction HD1 and may be spaced apart from each other in a second horizontal direction HD2. In this case, the first horizontal direction HD1 and the second horizontal direction HD2 may be orthogonal to each other. However, the inventive concepts are not limited thereto and in other embodiments the first horizontal direction HD1 and the second horizontal direction HD2 are not orthogonal to each other. The first to third upper word lines WL1u to WL3u may extend in the first horizontal direction HD1 and may be spaced apart from each other in the second horizontal direction HD2. The first to third upper word lines WL1u to WL3u may be respectively spaced apart in a vertical direction VD on (or from) the first to third lower word lines WL1d to WL3d. The first to third bit lines BL1 to BL3 may be respectively spaced apart from the first to third lower word lines WL1d to WL3d and the first to third upper word lines WL1u to WL3u in the vertical direction VD and may extend in the second horizontal direction HD2.

Also, the memory cell array 110c may further include a plurality of lower memory cells MC11d to MC33d (i.e., MC11d, MC12d, MC13d, MC21d, MC22d, MC23d, MC31d, MC32d and MC33d) respectively arranged in regions where the first to third lower word lines WL1d to WL3d intersect with the first to third bit lines BL1 to BL3, and a plurality of upper memory cells MC11u to MC33u (i.e., MC11u, MC12u, MC13u, MC21u, MC22u, MC23u, MC31u, MC32u and MC33u) respectively arranged in regions where the first to third upper word lines WL1u to WL3u intersect with the first to third bit lines BL1 to BL3. In this case, the plurality of lower memory cells MC11d to MC33d may correspond to a first layer or a lower layer, and the plurality of upper memory cells MC11u to MC33u may correspond to a second layer or an upper layer. The first and second layers may share the first to third bit lines BL1 to BL3. However, the inventive concepts are not limited thereto, and the memory cell array 110c may have a structure in which three or more layers are vertically stacked.

For example, a selected bit line (BLsel) may be the second bit line BL2 and a selected word line (WLsel) may be the second lower word line WL2d, and accordingly, a selected memory cell may be the lower memory cell MC22d. When the selected memory cell is included in the first layer, unselected memory cells to which a dummy pulse is applied during a write operation may include memory cells in the first layer and memory cells in the second layer. In this case, the unselected memory cells to which a dummy pulse is applied during a write operation may be divided into a plurality of cell groups, and different voltages may be applied to different cell groups.

In an embodiment, among the memory cells arranged in the first layer that is the same layer as the selected memory cell MC22d, the lower memory cells MC21d and MC23d adjacent to the selected memory cell MC22d in the first horizontal direction HD1 and the lower memory cells MC12d and MC32d adjacent to the selected memory cell MC22d in the second horizontal direction HD2 may be included in a first cell group GR1. In addition, in an embodiment, among the memory cells arranged in the second layer that is a different layer from the selected memory cell MC22d, the upper memory cell MC22u connected to the second bit line BL2 and adjacent to the selected memory cell MC22d in the vertical direction VD may also be included in the first cell group GR1. In this case, voltages across the memory cells in the first cell group GR1 may correspond to a first voltage V1.

In an embodiment, among the memory cells arranged in the first layer that is the same layer as the selected memory cell MC22d, the lower memory cells MC11d, MC13d, MC31d, and MC33d diagonally adjacent to the selected memory cell MC22d may be included in a second cell group GR2. In this case, voltages across the memory cells in the second cell group GR2 may correspond to a second voltage V2, and the voltage level of the second voltage V2 may be lower than the voltage level of the first voltage V1. In an embodiment, memory cells not included in the first and second cell groups GR1 and GR2 may be included in a third cell group GR3. In this case, voltages across the memory cells in the third cell group GR3 may correspond to a third voltage V3, and the voltage level of the third voltage V3 may be lower than the voltage level of the second voltage V2.

In some embodiments, among the memory cells arranged in the second layer that is a different layer from the selected memory cell MC22d, the upper memory cells MC12u and MC32u connected to the second bit line BL2 and diagonally adjacent to the selected memory cell MC22d may also be included in the second cell group GR2. In some embodiments, among the memory cells arranged in the second layer that is a different layer from the selected memory cell MC22d, the upper memory cells MC11u, MC13u, MC21u, MC23u, MC31u, and MC33u connected to the first and third bit lines BL1 and BL3 and diagonally adjacent to the selected memory cell MC22d may also be included in the second cell group GR2.

Figure 17:
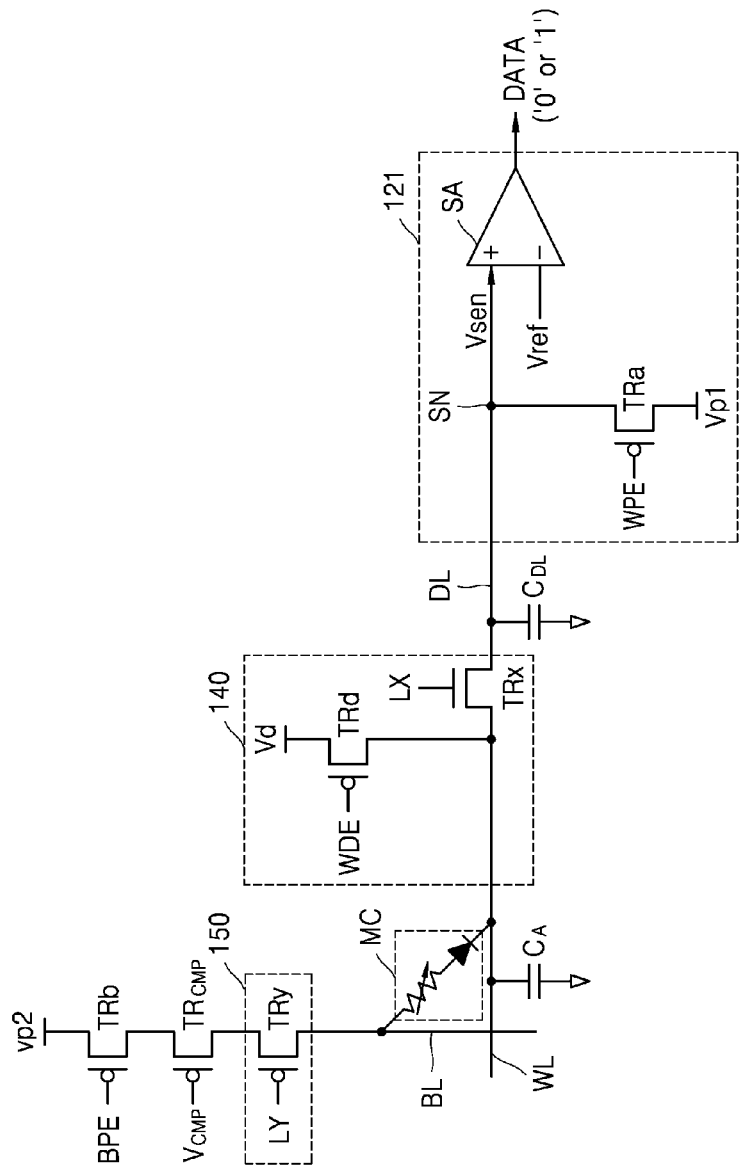
FIG. 17 illustrates a circuit diagram showing components for performing a dummy read operation of a memory device according to embodiments of the inventive concepts.

FIG. 17 illustrates a circuit diagram showing components for performing a dummy read operation of a memory device according to embodiments of the inventive concepts.

Referring to FIG. 17, during a write operation on a selected memory cell, a write pulse may be applied to the selected memory cell, and then a dummy pulse may be applied to an unselected memory cell. In an embodiment, the dummy pulse may have a voltage level corresponding to a read voltage. Accordingly, an operation of applying a dummy pulse may be referred to as a "dummy read operation". Hereinafter, an operation of applying a dummy pulse to an unselected memory cell will be described.

A word line WL may be connected to one end of a memory cell MC, and a bit line BL may be connected to the other end of the memory cell MC. A row decoder 140 may be connected to the word line WL. For example, the row decoder 140 may include a word line select transistor TRx and a discharge transistor TRd. The word line select transistor TRx may be turned on or off in response to a word line select signal LX. When the word line select transistor TRx is turned on, the word line WL may be connected to a sense amplification block 121 through a data line DL. The discharge transistor TRd may be turned on or off in response to a discharge enable signal WDE. When the discharge transistor TRd is turned on, a discharge voltage Vd may be applied to the word line WL. For example, the discharge voltage Vd may be 0 V.

A column decoder 150 may be connected to the bit line BL and may include a bit line select transistor TRy. Also, the column decoder 150 may further include a discharge transistor (not shown). The bit line select transistor TRy may be connected to control switches, for example, a clamping transistor $TR_{CMP}$ and a bit line pre-charge transistor TRb. The bit line pre-charge transistor TRb and the clamping transistor $TR_{CMP}$ may be understood as components of the sense amplification block 121. The bit line select transistor TRy is turned on or off in response to a bit line select signal LY. The bit line pre-charge transistor TRb may be turned on or off in response to a bit line pre-charge enable signal BPE. In this case, the clamping transistor $TR_{CMP}$ may be controlled to apply a certain voltage to the bit line BL based on a clamping voltage $V_{CMP}$.

The sense amplification block 121 may include a word line pre-charge transistor TRa and a sense amplifier SA. The word line pre-charge transistor TRa may be turned on or off in response to a word line pre-charge enable signal WPE. When the word line select transistor TRx and the word line pre-charge transistor TRa are turned, a first pre-charge voltage Vp1 may be applied to the word line WL. The word line WL and the bit line BL may each include a parasitic capacitor, and the capacitance of the parasitic capacitor of the word line WL, for example, a word line capacitor $C_A$, may be less than that of the parasitic capacitor (not shown) of the bit line BL. Accordingly, the sense amplifier SA may be connected to the word line WL having relatively little influence by the parasitic capacitor and may sense the voltage level of the word line WL, thereby reading data of a selected memory cell MC.

The sense amplifier SA may compare a sensing voltage Vsen of a sensing node SN, for example a voltage level of the data line DL (in this case, the voltage level of the data line DL is the same as the voltage level of the word line WL), with a reference voltage Vref, and may output a comparison result as data DATA. In other words, the sense amplifier SA may operate as a comparator. For example, when the memory cell MC is in a set state, the sensing voltage Vsen may be higher than the reference voltage Vref, and the sense amplifier SA may output '1' as the data DATA. When the memory cell MC is in a reset state, the sensing voltage Vsen may be lower than the reference voltage Vref, and the sense amplifier SA may output '0' as the data DATA.

Figure 18:
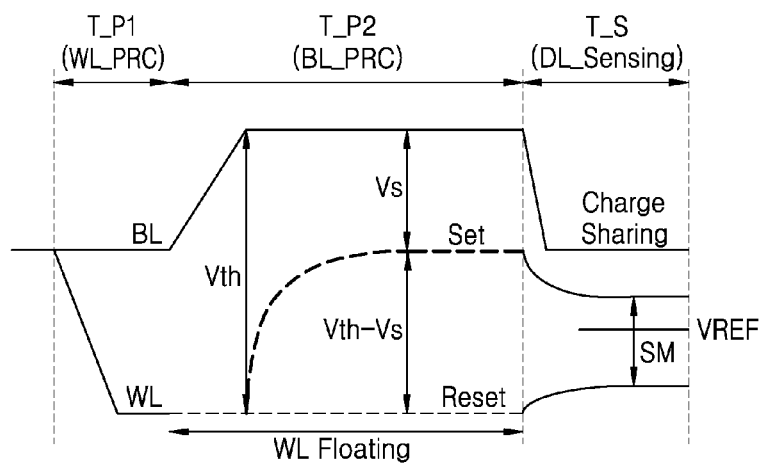
FIG. 18 illustrates a timing diagram of a dummy read operation on unselected memory cells, according to embodiments of the inventive concepts.

FIG. 18 illustrates a timing diagram of a dummy read operation on unselected memory cells, according to embodiments of the inventive concepts.

Referring to FIGS. 17 and 18 together, the horizontal axis of the graph of FIG. 18 represents time and the vertical axis (not shown) of the graph of FIG. 18 represents voltage levels of the bit line BL and the word lines WL. The memory device may pre-charge the word line WL to the first pre-charge voltage Vp1 in a first pre-charge period T_P1, for example, a word line pre-charge period WL_PRC. When the word line select transistor TRx and the word line pre-charge transistor TRa are turned on, the word line WL and the data line DL may be pre-charged to the first pre-charge voltage Vp1. In an embodiment, the first pre-charge voltage Vp1 may be a negative voltage, and the voltage level of the word line WL may drop to the first pre-charge voltage Vp1. In this case, the bit line select transistor TRy may be turned off, and thus, the bit line BL may be in a floating state. When the memory cell MC is a selected memory cell, the discharge transistor TRd may maintain a turn-off state during a read operation.

The word line WL may be floated in a second pre-charge period T_P2, for example, a bit line pre-charge period BL_PRC, and the bit line BL may be pre-charged to the second pre-charge voltage Vp2. The bit line select transistor TRy and the bit line pre-charge transistor TRb may be turned on in the second pre-charge period T_P2, and thus, the second pre-charge voltage Vp2 may be applied to the bit line BL. In an embodiment, a power supply voltage may be applied through the bit line pre-charge transistor TRb, and the clamping transistor $TR_{CMP}$ may maintain the voltage level of the bit line BL as the second pre-charge voltage Vp2.

In the second pre-charge period T_P2, the voltage level of the bit line BL may increase to the second pre-charge voltage Vp2. In this case, when a difference between the voltage level of the bit line BL and the voltage level of the word line WL is equal to or greater than a threshold voltage Vth of the memory cell MC, a cell current may flow in the memory cell MC. For example, the applied voltages illustrated in FIGS. 7, 12, 14, and 16 may correspond to a difference between the voltage level of the bit line BL and the voltage level of the word line WL.

When the memory cell MC is in the set state, the voltage level of the word line WL may increase, and the difference between the voltage level of the word line WL and the voltage level of the bit line BL may be maintained above a blocking voltage Vs (i.e., a voltage level at which the cell current of the memory cell MC is blocked). Accordingly, when the memory cell MC is in the set state, the voltage level of the word line WL may increase up to a voltage level obtained by reducing the voltage level of the bit line BL by the blocking voltage Vs. On the other hand, when the memory cell MC is in the reset state, the voltage level of the word line WL may hardly increase or may increase very little.

In some embodiments, in the second pre-charge period T_P2, the bit line BL may be pre-charged to the second pre-charge voltage Vp2 while the word line select transistor TRx is weakly turned on. In this case, as the word line select transistor TRx is weakly turned on, the word line WL may be pseudo-floated. As described above, the word line select transistor TRx may be turned on when the word line select signal LX is at a high level, and may be turned off when the word line select signal LX is at a low level.

The word line select transistor TRx may be turned on in a sensing period T_S, and thus, the word line WL and the data line DL may be connected to each other and charge sharing may be performed. The voltage level of the word line WL may be the same as the voltage level of the data line DL by the charge sharing, and the voltage level of the word line WL may be changed as shown in FIG. 18. When the charge sharing is completed, data may be sensed based on the voltage level of the data line DL, for example, the sensing voltage Vsen. The sense amplifier SA may sense data by comparing the reference voltage Vref with the sensing voltage Vsen.

In the process of charge sharing, especially when the memory cell MC is in the set state, the voltage level of the word line WL may be reduced by the charge sharing. In this case, when the amount of reduction is large, the sensing margin of the sense amplifier SA may be reduced. However, because the word line select transistor TRx is weakly turned on in the second pre-charge period T_P2 and thus the data line DL is charged by a leakage current of the word line select transistor TRx, an effect such as an increase in the capacitance of the word line capacitor CA may occur. Accordingly, when the memory cell MC is in the set state, the amount of change in the voltage level of the word line WL may decrease, thereby sufficiently securing the sensing margin SM.

Figure 19:
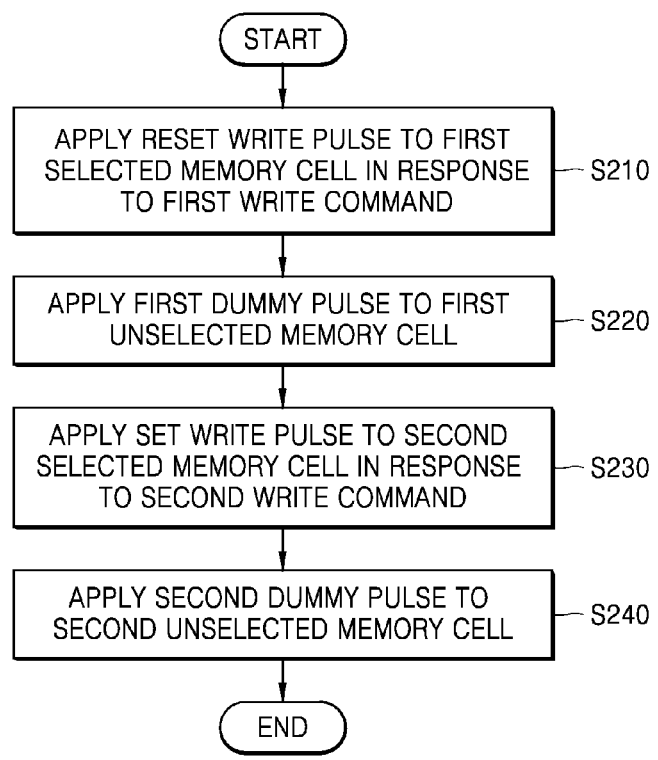
FIG. 19 illustrates a flowchart of a method of programming a memory device, according to embodiments of the inventive concepts.

FIG. 19 illustrates a flowchart of a method of programming a memory device, according to embodiments of the inventive concepts. Referring to FIG. 19, the method according to the present embodiment corresponds to an operation of writing data in a memory device according to a write request from a host. For example, the method may include operations performed in a time series in the memory device 100 of FIG. 1. The method according to the present embodiment may correspond to a modification of the method described with respect to FIG. 8.

In operation S210, the memory device 100 applies, in response to a first write command, a reset write pulse to a first selected memory cell arranged in a region where a first selected word line intersects with a first selected bit line. In operation S220, the memory device 100 applies a first dummy pulse to at least one first unselected memory cell. For example, the at least one first unselected memory cell may be connected to at least one of the first selected word line, the first selected bit line, a first word line adjacent to the first selected word line, and a first bit line adjacent to the first selected bit line.

In operation S230, the memory device 100 applies, in response to a second write command, a set write pulse to a second selected memory cell arranged in a region where a second selected word line intersects with a second selected bit line. In operation S240, the memory device 100 applies a second dummy pulse to at least one second unselected memory cell. For example, the at least one second unselected memory cell may be connected to at least one of the second selected word line, the second selected bit line, a second word line adjacent to the second selected word line, and a second bit line adjacent to the second selected bit line. In an embodiment, the first dummy pulse may have a first pulse width, and the second dummy pulse may have a second pulse width that is less than the first pulse width. In an embodiment, the first dummy pulse may have a first amplitude, and the second dummy pulse may have a second amplitude that is less than the first amplitude.

Figure 20:
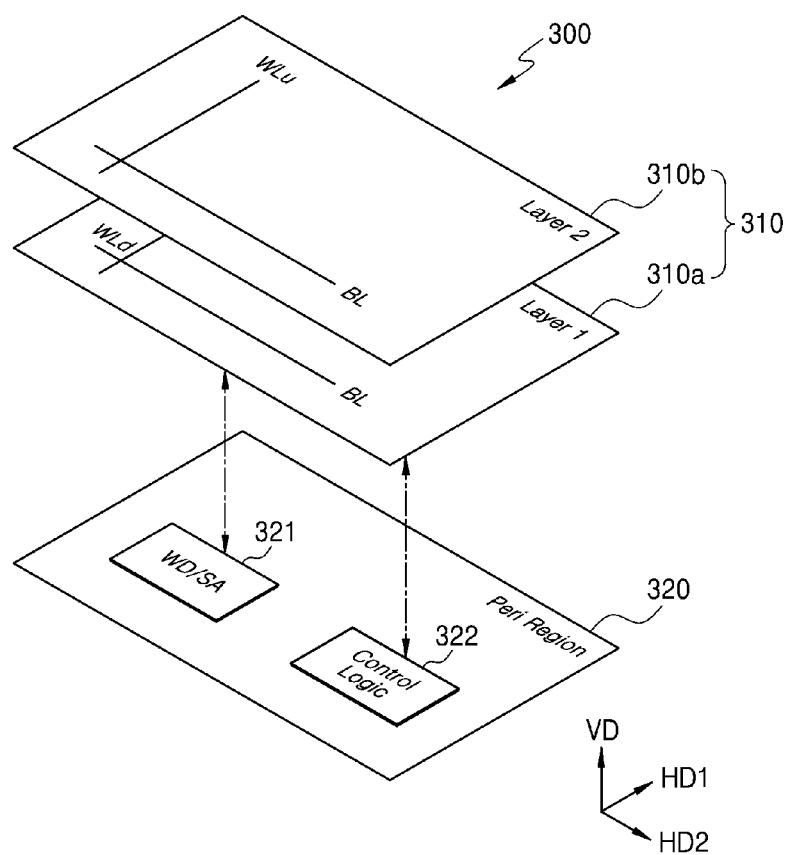
FIG. 20 illustrates a memory device having a cell over peripheral (COP) structure according to embodiments of the inventive concepts.

FIG. 20 illustrates a memory device 300 having a cell over peripheral (COP) structure according to embodiments of the inventive concepts. Referring to FIG. 20, the memory device 300 may include first and second semiconductor layers 310 and 320 stacked in a vertical direction VD. The first semiconductor layer 310 may include first and second layers 310a and 310b. In some embodiments, the first semiconductor layer 310 may further include at least one layer on the second layer 310b. The first layer 310a may include lower word lines WLd, the second layer 310b may include upper word lines WLu, and the first layer 310a and the second layer 310b may share bit lines BL. For example, the first layer 310a may include the lower memory cells MC11d to MC33d in FIG. 15, and the second layer 310b may include the upper memory cells MC11u to MC33u in FIG. 15.

The first layer 310a may further include lower memory cells respectively arranged in regions where the lower word lines WLd intersect with the bit lines BL, and the second layer 310b may further include upper memory cells respectively arranged in regions where the upper word lines WLu intersect with the bit lines BL. A peripheral region including peripheral circuits may be arranged on the second semiconductor layer 320. For example, a write/read circuit (WD/SA) 321 and a control logic 322 may be arranged on the second semiconductor layer 320. However, the inventive concepts are not limited thereto, and various types of peripheral circuits related to memory operations may be arranged in the second semiconductor layer 320.

Figure 21:
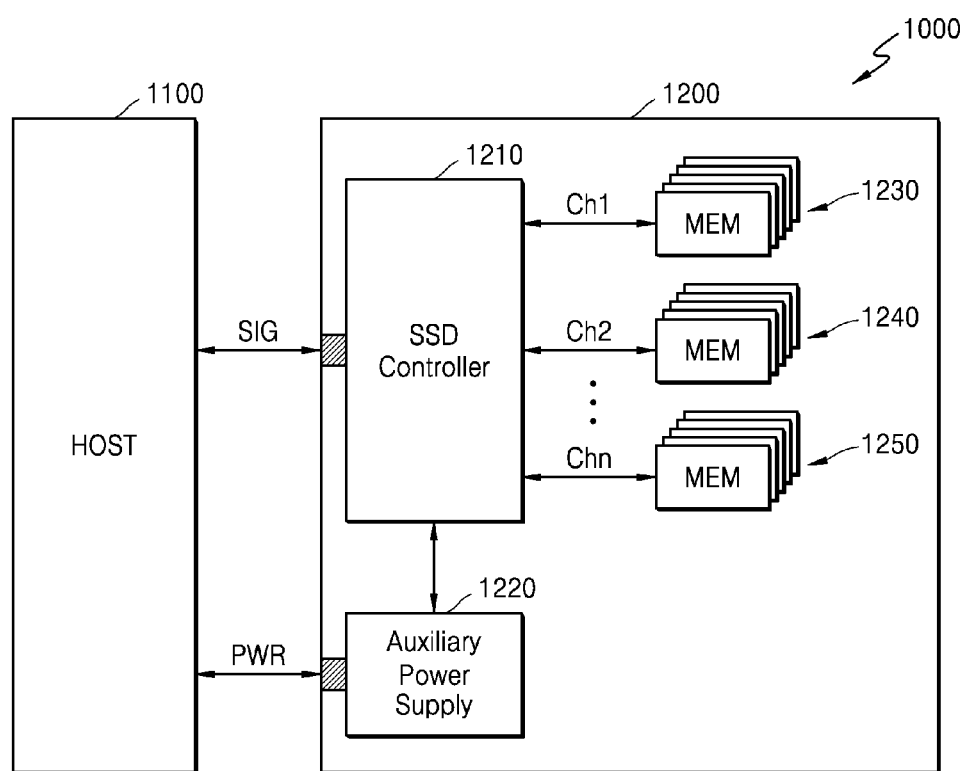
FIG. 21 illustrates a block diagram showing an example in which a memory device according to some embodiments of the inventive concepts is applied to a solid state drive (SSD) system.

FIG. 21 illustrates a block diagram of an example in which a memory device according to some embodiments of the inventive concepts is applied to a solid state drive (SSD) system 1000. Referring to FIG. 21, the SSD system 1000 may include a host 1100 and an SSD 1200. The SSD 1200 may exchange signals (SIG) with the host 1100 through a signal connector and receive power (PWR) through a power connector. The SSD 1200 may include an SSD controller 1210, an auxiliary power supply 1220, and memory devices 1230, 1240, and 1250. The memory devices 1230, 1240, and 1250 may be implemented using the embodiments described above with reference to FIGS. 1 to 20.

Figure 22:
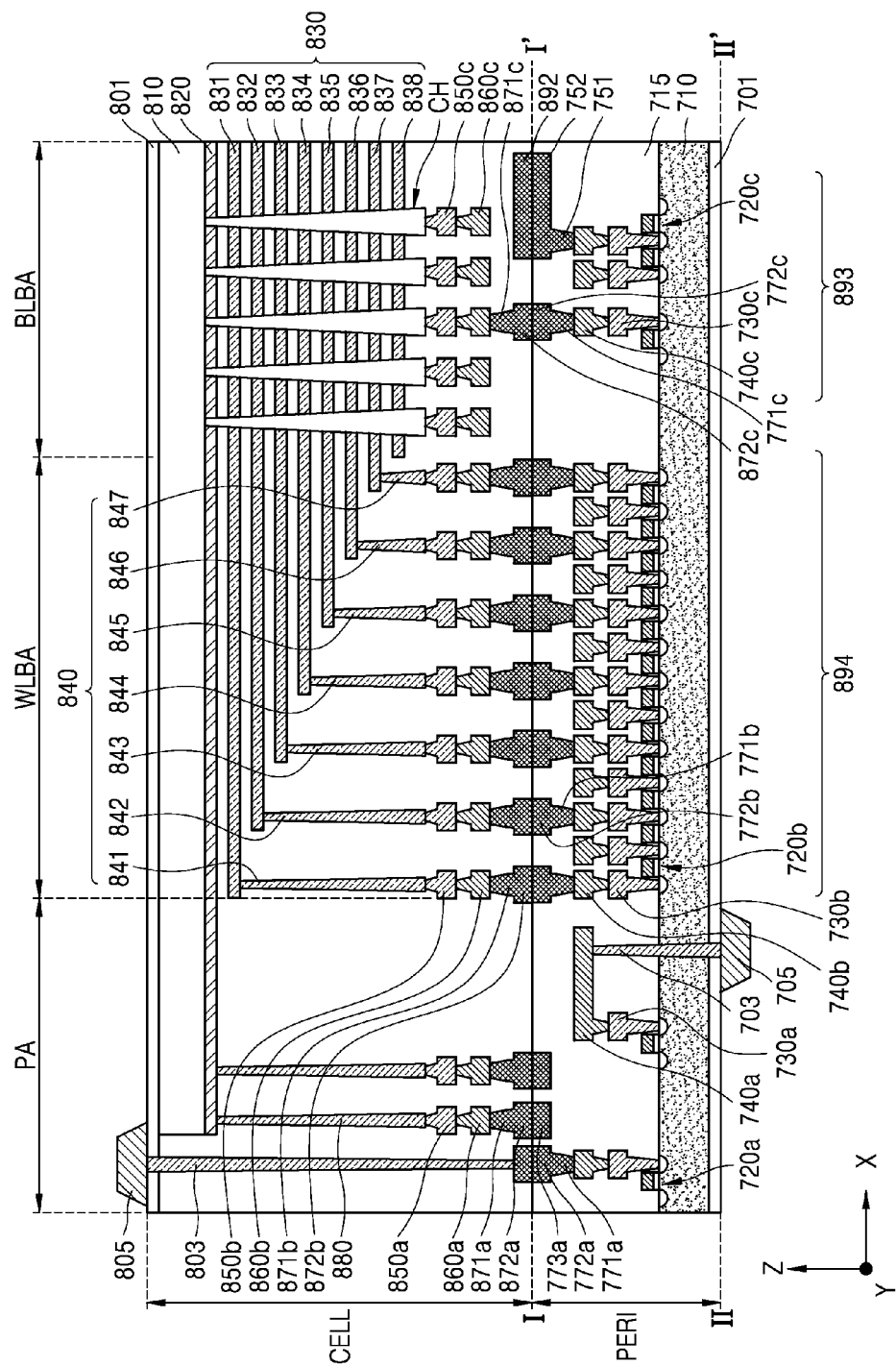
FIG. 22 illustrates a memory device having a chip-to-chip structure, according to embodiments of the inventive concept.

FIG. 22 illustrates a memory device having a chip-to-chip structure, according to embodiments of the inventive concept.

Referring to FIG. 22, a memory device 900 may have a chip-to-chip (C2C) structure. The C2C structure may refer to a structure formed by manufacturing an upper chip including a cell region CELL on a first wafer, manufacturing a lower chip including a peripheral circuit region PERI on a second wafer, different from the first wafer, and then connecting the upper chip and the lower chip in a bonding manner. For example, the bonding manner may include a method of electrically connecting a bonding metal formed on an uppermost metal layer of the upper chip and a bonding metal formed on an uppermost metal layer of the lower chip. For example, when the bonding metals may be formed of copper (Cu), the bonding manner may be a Cu—Cu bonding, and the bonding metals may also be formed of aluminum or tungsten.

Each of the peripheral circuit region PERI and the cell region CELL of the memory device 900 may include an external pad bonding area PA, a word line bonding area WLBA, and a bit line bonding area BLBA.

The peripheral circuit region PERI may include a first substrate 710, an interlayer insulating layer 715, a plurality of circuit elements 720a, 720b, and 720c formed on the first substrate 710, first metal layers 730a, 730b, and 730c respectively connected to the plurality of circuit elements 720a, 720b, and 720c, and second metal layers 740a, 740b, and 740c formed on the first metal layers 730a, 730b, and 730c. In an example embodiment, the first metal layers 730a, 730b, and 730c may be formed of tungsten having relatively high resistance, and the second metal layers 740*a*, 740*b*, and 740*c* may be formed of copper having relatively low resistance.

In an example embodiment illustrate in FIG. 22, although the first metal layers 730*a*, 730*b*, and 730*c* and the second metal layers 740*a*, 740*b*, and 740*c* are shown and described, they are not limited thereto, and one or more metal layers may be further formed on the second metal layers 740*a*, 740*b*, and 740*c*. At least a portion of the one or more metal layers formed on the second metal layers 740*a*, 740*b*, and 740*c* may be formed of aluminum or the like having a lower resistance than those of copper forming the second metal layers 740*a*, 740*b*, and 740*c*.

The interlayer insulating layer 715 may be disposed on the first substrate 710 and cover the plurality of circuit elements 720*a*, 720*b*, and 720*c*, the first metal layers 730*a*, 730*b*, and 730*c*, and the second metal layers 740*a*, 740*b*, and 740*c*. The interlayer insulating layer 715 may include an insulating material such as silicon oxide, silicon nitride, or the like.

Lower bonding metals 771*b* and 772*b* may be formed on the second metal layer 740*b* in the word line bonding area WLBA. In the word line bonding area WLBA, the lower bonding metals 771*b* and 772*b* in the peripheral circuit region PERI may be electrically connected to c in a bonding manner, and the lower bonding metals 771*b* and 772*b* and the upper bonding metals 871*b* and 872*b* may be formed of aluminum, copper, tungsten, or the like. Further, the upper bonding metals 871*b* and 872*b* in the cell region CELL may be referred as first metal pads and the lower bonding metals 771*b* and 772*b* in the peripheral circuit region PERI may be referred as second metal pads.

The cell region CELL may include at least one memory block. The cell region CELL may include a second substrate 810 and a common source line 820. On the second substrate 810, a plurality of word lines 831 to 838 (i.e., 830) may be stacked in a direction (a Z-axis direction), perpendicular to an upper surface of the second substrate 810. At least one string select line and at least one ground select line may be arranged on and below the plurality of word lines 830, respectively, and the plurality of word lines 830 may be disposed between the at least one string select line and the at least one ground select line.

In the bit line bonding area BLBA, a channel structure CH may extend in a direction, perpendicular to the upper surface of the second substrate 810, and pass through the plurality of word lines 830, the at least one string select line, and the at least one ground select line. The channel structure CH may include a data storage layer, a channel layer, a buried insulating layer, and the like, and the channel layer may be electrically connected to a first metal layer 850*c* and a second metal layer 860*c*. For example, the first metal layer 850*c* may be a bit line contact, and the second metal layer 860*c* may be a bit line. In an example embodiment, the bit line 860*c* may extend in a first direction (a Y-axis direction), parallel to the upper surface of the second substrate 810.

In an example embodiment illustrated in FIG. 22, an area in which the channel structure CH, the bit line 860*c*, and the like are disposed may be defined as the bit line bonding area BLBA. In the bit line bonding area BLBA, the bit line 860*c* may be electrically connected to the circuit elements 720*c* providing a page buffer 893 in the peripheral circuit region PERI. For example, the bit line 860*c* may be connected to upper bonding metals 871*c* and 872*c* in the cell region CELL, and the upper bonding metals 871*c* and 872*c* may be connected to lower bonding metals 771*c* and 772*c* connected to the circuit elements 720*c* of the page buffer 893.

In the word line bonding area WLBA, the plurality of word lines 830 may extend in a second direction (an X-axis direction), parallel to the upper surface of the second substrate 810, and may be connected to a plurality of cell contact plugs 841 to 847 (i.e., 840). The plurality of word lines 830 and the plurality of cell contact plugs 840 may be connected to each other in pads provided by at least a portion of the plurality of word lines 830 extending in different lengths in the second direction. A first metal layer 850*b* and a second metal layer 860*b* may be connected to an upper portion of the plurality of cell contact plugs 840 connected to the plurality of word lines 830, sequentially. The plurality of cell contact plugs 840 may be connected to the circuit region PERI by the upper bonding metals 871*b* and 872*b* of the cell region CELL and the lower bonding metals 771*b* and 772*b* of the peripheral circuit region PERI in the word line bonding area WLBA.

The plurality of cell contact plugs 840 may be electrically connected to the circuit elements 720*b* providing a row decoder 894 in the peripheral circuit region PERI. In an example embodiment, operating voltages of the circuit elements 720*b* providing the row decoder 894 may be different than operating voltages of the circuit elements 720*c* providing the page buffer 893. For example, operating voltages of the circuit elements 720*c* providing the page buffer 893 may be greater than operating voltages of the circuit elements 720*b* providing the row decoder 894.

A common source line contact plug 880 may be disposed in the external pad bonding area PA. The common source line contact plug 880 may be formed of a conductive material such as a metal, a metal compound, polysilicon, or the like, and may be electrically connected to the common source line 820. A first metal layer 850*a* and a second metal layer 860*a* may be stacked on an upper portion of the common source line contact plug 880, sequentially. For example, an area in which the common source line contact plug 880, the first metal layer 850*a*, and the second metal layer 860*a* are disposed may be defined as the external pad bonding area PA.

Input-output pads 705 and 805 may be disposed in the external pad bonding area PA. Referring to FIG. 22, a lower insulating film 701 covering a lower surface of the first substrate 710 may be formed below the first substrate 710, and a first input-output pad 705 may be formed on the lower insulating film 701. The first input-output pad 705 may be connected to at least one of the plurality of circuit elements 720*a*, 720*b*, and 720*c* disposed in the peripheral circuit region PERI through a first input-output contact plug 703, and may be separated from the first substrate 710 by the lower insulating film 701. In addition, a side insulating film may be disposed between the first input-output contact plug 703 and the first substrate 710 to electrically separate the first input-output contact plug 703 and the first substrate 710.

Referring to FIG. 22, an upper insulating film 801 covering the upper surface of the second substrate 810 may be formed on the second substrate 810, and a second input-output pad 805 may be disposed on the upper insulating layer 801. The second input-output pad 805 may be connected to at least one of the plurality of circuit elements 720*a*, 720*b*, and 720*c* disposed in the peripheral circuit region PERI through a second input-output contact plug 803. For example, the second input-output contact plug 803 may be connected to the circuit element 720*a* through lower bonding metals 771*a* and 772*a*.

According to embodiments, the second substrate 810 and the common source line 820 may not be disposed in an area in which the second input-output contact plug 803 is disposed. Also, the second input-output pad 805 may not overlap the word lines 830 in the third direction (the Z-axis direction). Referring to FIG. 22, the second input-output contact plug 803 may be separated from the second substrate 810 in a direction, parallel to the upper surface of the second substrate 810, and may pass through the interlayer insulating layer 815 of the cell region CELL to be connected to the second input-output pad 805.

According to embodiments, the first input-output pad 705 and the second input-output pad 805 may be selectively formed. For example, the memory device 900 may include only the first input-output pad 705 disposed on the first substrate 710 or the second input-output pad 805 disposed on the second substrate 810. Alternatively, the memory device 900 may include both the first input-output pad 705 and the second input-output pad 805.

A metal pattern in an uppermost metal layer may be provided as a dummy pattern or the uppermost metal layer may be absent, in each of the external pad bonding area PA and the bit line bonding area BLBA, respectively included in the cell region CELL and the peripheral circuit region PERI.

In the external pad bonding area PA, the memory device 900 may include a lower metal pattern 773*a*, corresponding to an upper metal pattern 872*a* formed in an uppermost metal layer of the cell region CELL, and having the same shape as the upper metal pattern 872*a* of the cell region CELL, in an uppermost metal layer of the peripheral circuit region PERI. In the peripheral circuit region PERI, the lower metal pattern 773*a* formed in the uppermost metal layer of the peripheral circuit region PERI may not be connected to a contact. Similarly, in the external pad bonding area PA, an upper metal pattern, corresponding to the lower metal pattern formed in an uppermost metal layer of the peripheral circuit region PERI, and having the same shape as a lower metal pattern of the peripheral circuit region PERI, may be formed in an uppermost metal layer of the cell region CELL.

The lower bonding metals 771*b* and 772*b* may be formed on the second metal layer 740*b* in the word line bonding area WLBA. In the word line bonding area WLBA, the lower bonding metals 771*b* and 772*b* of the peripheral circuit region PERI may be electrically connected to the upper bonding metals 871*b* and 872*b* of the cell region CELL by a Cu—Cu bonding.

Further, in the bit line bonding area BLBA, an upper metal pattern 892, corresponding to a lower metal pattern 752 formed in the uppermost metal layer of the peripheral circuit region PERI, and having the same shape as the lower metal pattern 752 of the peripheral circuit region PERI, may be formed in an uppermost metal layer of the cell region CELL. A contact may not be formed on the upper metal pattern 892 formed in the uppermost metal layer of the cell region CELL. For example, the lower metal pattern 752 may be connected to the circuit element 720*c* through a lower bonding metal 751.

In an example embodiment, corresponding to a metal pattern formed in an uppermost metal layer in one of the cell region CELL and the peripheral circuit region PERI, a reinforcement metal pattern having the same shape as the metal pattern may be formed in an uppermost metal layer in another one of the cell region CELL and the peripheral circuit region PERI, and a contact may not be formed on the reinforcement metal pattern.

While the inventive concepts have been particularly shown and described with reference to embodiments thereof, it should be understood that various changes in form and details may be made therein without departing from the spirit and scope of the following claims.

What is claimed is:

1. A resistive memory device comprising:
   a memory cell array including a plurality of memory cells respectively arranged in regions where a plurality of word lines intersect with a plurality of bit lines; and
   a write/read circuit connected to the memory cell array,
   wherein during a write operation on a selected memory cell of the plurality of memory cells, the write/read circuit is configured to:
      apply a write pulse to the selected memory cell, and
      apply a dummy pulse to at least one unselected memory cell of the
      plurality of memory cells after applying the write pulse to the
      selected memory cell, and
   wherein the at least one unselected memory cell is connected to at least one of a selected word line connected to the selected memory cell, a selected bit line connected to the selected memory cell, a first word line adjacent to the selected word line, and a first bit line adjacent to the selected bit line.

2. The resistive memory device of claim 1, further comprising a controller configured to select the at least one unselected memory cell and control the write pulse and the dummy pulse.

3. The resistive memory device of claim 2, further comprising:
   a row decoder configured to perform a selection operation on the plurality of word lines; and
   a column decoder configured to perform a selection operation on the plurality of bit lines,
   wherein the controller is further configured to control the row decoder and the column decoder such that a number of unselected memory cells selected when the write operation is a reset write operation is greater than a number of unselected memory cells selected when the write operation is a set write operation.

4. The resistive memory device of claim 2, wherein the at least one unselected memory cell includes at least one first memory cell in a first cell group and at least one second memory cell in a second cell group,
   wherein the controller is further configured to control the write/read circuit to apply a first dummy pulse to the at least one first memory cell and a second dummy pulse to the at least one second memory cell.

5. The resistive memory device of claim 4, wherein a distance between the at least one first memory cell and the selected memory cell is less than a distance between the at least one second memory cell and the selected memory cell, and
   a voltage applied to the at least one first memory cell is higher than a voltage applied to the at least one second memory cell.

6. The resistive memory device of claim 4, wherein the plurality of word lines include a plurality of lower word lines and a plurality of upper word lines,
   wherein the plurality of memory cells include a plurality of lower memory cells respectively arranged in regions where the plurality of lower word lines intersect with the plurality of bit lines, and a plurality of upper memory cells respectively arranged in regions where the plurality of upper word lines intersect with the plurality of bit lines, and the at least one unselected memory cell includes a memory cell adjacent to the selected memory cell in a vertical direction.

7. The resistive memory device of claim 1, wherein an amplitude of the dummy pulse is less than an amplitude of the write pulse, or a pulse width of the dummy pulse is less than a pulse width of the write pulse.

8. A resistive memory device comprising:
a memory cell array including a plurality of memory cells respectively arranged in regions where a plurality of word lines intersect a plurality of bit lines;
a controller configured to determine a selected memory cell from among the memory cell array and at least first and second groups of unselected memory cells from among the memory cell array responsive to a write request from a host; and
a write/read circuit connected to the memory cell array,
wherein during a write operation on a selected memory cell of the plurality of memory cells, the write/read circuit is configured to:
apply a write pulse to the selected memory cell, and
apply a first dummy pulse to the first group of unselected memory
cells and a second dummy pulse to the second group of unselected
memory cells after applying the write pulse to the selected memory
cell.

9. The resistive memory device of claim 8, wherein a distance between the second group of unselected memory cells and the selected memory cell is greater than a distance between the first group of unselected memory cells and the selected memory cell.

10. The resistive memory device of claim 9, wherein an amplitude of the first dummy pulse is greater than an amplitude of the second dummy pulse.

11. The resistive memory device of claim 9, wherein a pulse width of the first dummy pulse is greater than a pulse width of the second dummy pulse.

12. The resistive memory device of claim 9, wherein the write/read circuit is further configured to apply the second dummy pulse to the second group of unselected memory cells after the first dummy pulse is applied to the first group of unselected memory cells.

13. The resistive memory device of claim 9, wherein the write/read circuit is further configured to apply the first dummy pulse sequentially to the first group of unselected memory cells and to apply the second dummy pulse sequentially to the second group of unselected memory cells.

14. The resistive memory device of claim 9, wherein the write/read circuit is further configured to apply the first dummy pulse in parallel to the first group of unselected memory cells and to apply the second dummy pulse in parallel to the second group of unselected memory cells.

15. The resistive memory device of claim 8, wherein the first group of unselected memory cells are adjacent to the selected memory cell, and the second group of unselected memory cells are non-adjacent to the selected memory cell.

16. The resistive memory device of claim 8, wherein an amplitude of the first dummy pulse and an amplitude of the second dummy pulse are less than an amplitude of the write pulse.

17. The resistive memory device of claim 8, wherein a pulse width of the first dummy pulse and a pulse width of the second dummy pulse are less than a pulse width of the write pulse.

18. A resistive memory device comprising:
a memory cell region including a first metal pad;
a peripheral circuit region including a second metal pad and vertically connected to the memory cell region by the first metal pad and the second metal pad;
a memory cell array in the memory cell region, the memory cell array including a plurality of memory cells respectively arranged in regions where a plurality of word lines intersect with a plurality of bit lines; and
a write/read circuit in the peripheral circuit region,
wherein during a write operation on a selected memory cell of the plurality of memory cells, the write/read circuit is configured to:
apply a write pulse to the selected memory cell, and
apply a dummy pulse to at least one unselected memory cell of the
plurality of memory cells after applying the write pulse to the
selected memory cell,
wherein the at least one unselected memory cell is connected to at least one of a selected word line connected to the selected memory cell, a selected bit line connected to the selected memory cell, a first word line adjacent to the selected word line, and a first bit line adjacent to the selected bit line, and
wherein the first metal pad and the second metal pad are connected by bonding.

19. The resistive memory device of claim 18, wherein the memory cell region is formed on a first wafer and the peripheral circuit region is formed on a second wafer.

20. The resistive memory device of claim 18,
wherein the peripheral circuit region further includes a controller configured to select the at least one unselected memory cell and control the write pulse and the dummy pulse.

* * * * *